(12) United States Patent
Jang et al.

(10) Patent No.: US 7,859,507 B2
(45) Date of Patent: Dec. 28, 2010

(54) GATE DRIVER FOR DRIVING GATE LINES OF DISPLAY DEVICE AND METHOD FOR DRIVING THE SAME

(75) Inventors: Yong Ho Jang, Seongnam-si (KR); Binn Kim, Seoul (KR); Soo Young Yoon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 876 days.

(21) Appl. No.: 11/479,191

(22) Filed: Jun. 29, 2006

(65) Prior Publication Data

US 2007/0001991 A1    Jan. 4, 2007

(30) Foreign Application Priority Data

Jun. 30, 2005    (KR) ................ 10-2005-0058609

(51) Int. Cl.
  *G09G 3/36*    (2006.01)
  *G11C 19/00*    (2006.01)

(52) U.S. Cl. ..................... 345/100; 345/99; 377/64
(58) Field of Classification Search ............... 345/87, 345/94–96, 98–100, 204, 208–210, 691; 377/64–81
See application file for complete search history.

(56) References Cited

U.S. PATENT DOCUMENTS

| | | | | |
|---|---|---|---|---|
| 5,434,899 | A * | 7/1995 | Huq et al. ................ | 377/78 |
| 6,552,709 | B1 * | 4/2003 | Yamaguchi ............ | 345/99 |
| 6,690,347 | B2 * | 2/2004 | Jeon et al. ............. | 345/100 |
| 2004/0217935 | A1 * | 11/2004 | Jeon et al. ............. | 345/100 |

FOREIGN PATENT DOCUMENTS

| | | |
|---|---|---|
| JP | 62-271569 | 11/1987 |
| JP | 63-077031 | 4/1988 |
| JP | 02-000088 | 1/1990 |
| JP | 02-123326 | 5/1990 |
| JP | 02-239226 | 9/1990 |
| JP | 04-289893 | 10/1992 |

(Continued)

OTHER PUBLICATIONS

Office Action issued in corresponding Japanese Patent Application No. 2006-171649; issued Jun. 9, 2009.

*Primary Examiner*—Bipin Shalwala
*Assistant Examiner*—Keith Crawley
(74) *Attorney, Agent, or Firm*—Brinks Hofer Gilson & Lione

(57) ABSTRACT

A driving circuit of a display device and a method for driving the display device are disclosed which are capable of reducing distortion of scan pulses supplied to gate lines of a liquid crystal panel. The driving circuit includes a first shift register for sequentially supplying first scan pulses to one-side ends of gate lines included in a display, respectively, to sequentially drive the gate lines, the first shift register simultaneously driving at least two adjacent ones of the gate lines for a predetermined period of time, and a second shift register for sequentially supplying second scan pulses to the other-side ends of the gate lines, respectively, to sequentially drive the gate lines, the second shift register simultaneously driving at least two adjacent ones of the gate lines for a predetermined period of time.

24 Claims, 15 Drawing Sheets

FOREIGN PATENT DOCUMENTS

| | | |
|---|---|---|
| JP | 07-140439 | 6/1995 |
| JP | 08-062580 | 3/1996 |
| JP | 09-325738 | 12/1997 |
| JP | 10-198313 | 7/1998 |
| JP | 11-265174 | 9/1999 |
| JP | 2001-356738 | 12/2001 |
| JP | 2002-023683 | 1/2002 |
| JP | 2004-524639 | 8/2004 |

* cited by examiner (a)

(b)

_US 7,859,507 B2_

GATE DRIVER FOR DRIVING GATE LINES OF DISPLAY DEVICE AND METHOD FOR DRIVING THE SAME

This application claims the benefit of the Korean Patent Application No. P2005-0058609, filed on Jun. 30, 2005, which is hereby incorporated by reference as if fully set forth herein.

TECHNICAL FIELD

The present application relates to a driving circuit of a display device, and more particularly, to a driving circuit of a display device which is capable of sequentially outputting scan pulses having an increased pulse width, and a method for driving the display device.

BACKGROUND

Liquid crystal display (LCD) devices display an image by controlling the light transmittance of liquid crystal using an electric field. Such an LCD device includes an LCD panel having pixel regions arranged in the form of a matrix, and a driving circuit for driving the LCD panel.

In the LCD panel, a plurality of gate lines and a plurality of data lines are arranged such that they cross each other. The pixel regions of the LCD panel are arranged at regions defined by the crossing gate lines and data lines. Pixel electrodes and a common electrode are formed in the liquid crystal panel, to apply an electric field to each pixel region.

Each pixel electrode is connected to an associated one of the data lines via source and drain electrodes of a thin film transistor (TFT) which functions as a switching element. The TFT is turned on by a scan pulse applied to the gate electrode of the TFT via the associated gate line, to enable the pixel electrode to be charged with a data signal from the associated data line.

The driving circuit includes a gate driver for driving the gate lines, a data driver for driving the data lines, a timing controller for supplying control signals for control of the gate driver and data driver, and a power supply for supplying various drive voltages used in the LCD device.

The timing controller controls drive timings of the gate driver and data driver, and supplies a pixel data signal to the data driver. The power supply boosts or reduces an input voltage, to generate drive voltages such as a common voltage VCOM, a gate-high-voltage signal VGH, and a gate-low-voltage signal VGL. The gate driver sequentially supplies scan pulses to the gate lines, to enable liquid crystal cells of the LCD panel to be sequentially driven on a line-by-line basis. The data driver supplies a pixel voltage signal to each data line every time a scan pulse is supplied to one of the gate lines. In this manner, the LCD device displays an image by controlling the light transmittance of each liquid crystal cell by an electric field applied between the associated pixel electrode and the common electrode in accordance with a pixel voltage signal applied to the data line associated with the liquid crystal cell.

In order to sequentially output scan pulses, the gate driver includes a shift register such as is shown in FIG. 1. The shift register includes n stages AST1 to ASTn and one dummy stage ASTn+1 which are connected in series. The stages AST1 to ASTn+1 output scan pulses Vout1 to Voutn+1, respectively. That is, the scan pulses Vout1 to Voutn+1 are output in a sequential manner from the stages AST1 to ASTn+1, starting from the first stage AST1, and ending at the dummy stage ASTn+1. The scan pulses Vout1 to Voutn output from the stages AST1 to ASTn, except for the dummy stage ASTn+1, are sequentially supplied to gate lines of a liquid crystal panel (not shown), respectively, to cause the gate lines to be sequentially scanned.

Each of the stages AST1 to ASTn+1 of the shift register receives a first voltage VDD, a second voltage VSS, and two of first through fourth clock pulses CLK1 to CLK4. Successive clock pulses of the first through fourth clock pulses CLK1 to CLK4 have a phase difference from each other. The first voltage VDD is a positive voltage, whereas the second voltage VSS is a ground voltage.

The first stage AST1, which is arranged upstream from the remaining stages AST1 to ASTn+1, receives a start pulse SP, in addition to the first voltage VDD, second voltage VSS, and two clock pulses.

In an LCD device having an increased display area, gate lines thereof have an increased length. As the length of the gate lines increases, the resistance and capacitance components of the gate lines are increased. Scan pulses supplied to the gate lines may be distorted by the increased resistance and capacitance components. In FIG. 2, shows an ideal scan pulse 201 where it is assumed that there are no resistance and capacitance components in the associated gate line. On the other hand, resistance and capacitance components of the associated gate line increase the rise time TR of the scan pulse resulting in a distorted pulse 202, Since the distorted scan pulse 202 has an increased rise time TR, as compared to the ideal scan pulse 201, the effective charging time TS, for which the scan pulse is maintained at a target voltage VT, is shortened. When the scan pulse 202, which has a distorted waveform, as mentioned above, is applied to the gate electrode of the associated TFT, the turn-on time of the TFT is reduced, thereby reducing the time duration of the data voltage supplied from the associated data line by the turned-on TFT. As a result, the waveform of the data voltage applied to the associated pixel electrode via the drain/source terminal of the turned-on TFT is distorted, and the data voltage is insufficiently charged in the pixel electrode.

SUMMARY

A driving circuit for a display device is disclosed which is capable of sequentially outputting scan pulses having an increased pulse width, such that successive ones of the scan pulses are overlapped with each other for a predetermined time, to increase the effective charging time for which the scan pulses are maintained at a target voltage, and, a method for driving the display device.

in an aspect, a driving circuit of a display device comprises: a first shift register for sequentially supplying first scan pulses to one-side of the ends of gate lines included in a display, to sequentially drive the gate lines, the first shift register simultaneously driving at least two adjacent gate lines for a predetermined period of time; and, a second shift register for sequentially supplying second scan pulses to the other-side ends of the gate lines, to sequentially drive the gate lines, the second shift register simultaneously driving at least two adjacent gate lines for a predetermined period of time.

In another aspect, a method for driving a display device includes the steps of: sequentially supplying first scan pulses to one-side of the ends of gate lines in a display, to sequentially drive the gate lines, and to simultaneously drive at least two adjacent gate lines for a predetermined period of time; and sequentially supplying second scan pulses to the other-side of the ends of the gate lines, to sequentially drive the gate lines, to simultaneously drive at least two adjacent gate lines for a predetermined period of time.

DETAILED DESCRIPTION

Reference will now be made in detail to the exemplary embodiments of the present invention, which are illustrated in the accompanying drawings. Wherever possible, the same reference numbers will be used throughout the drawings to refer to the same or like parts.

Figure 1:
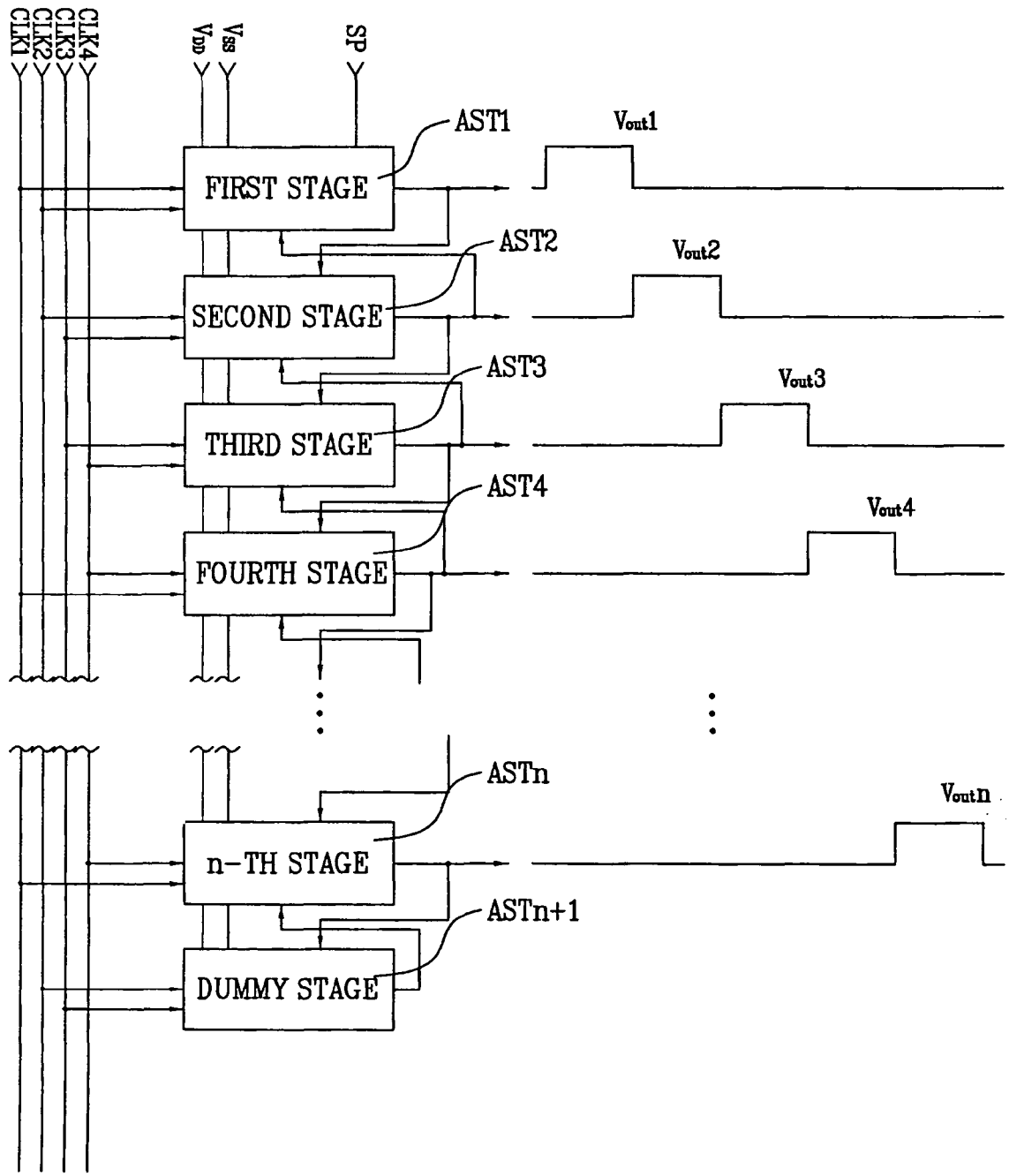
FIG. 1 is a diagram illustrating a conventional shift register.
Figure 2:
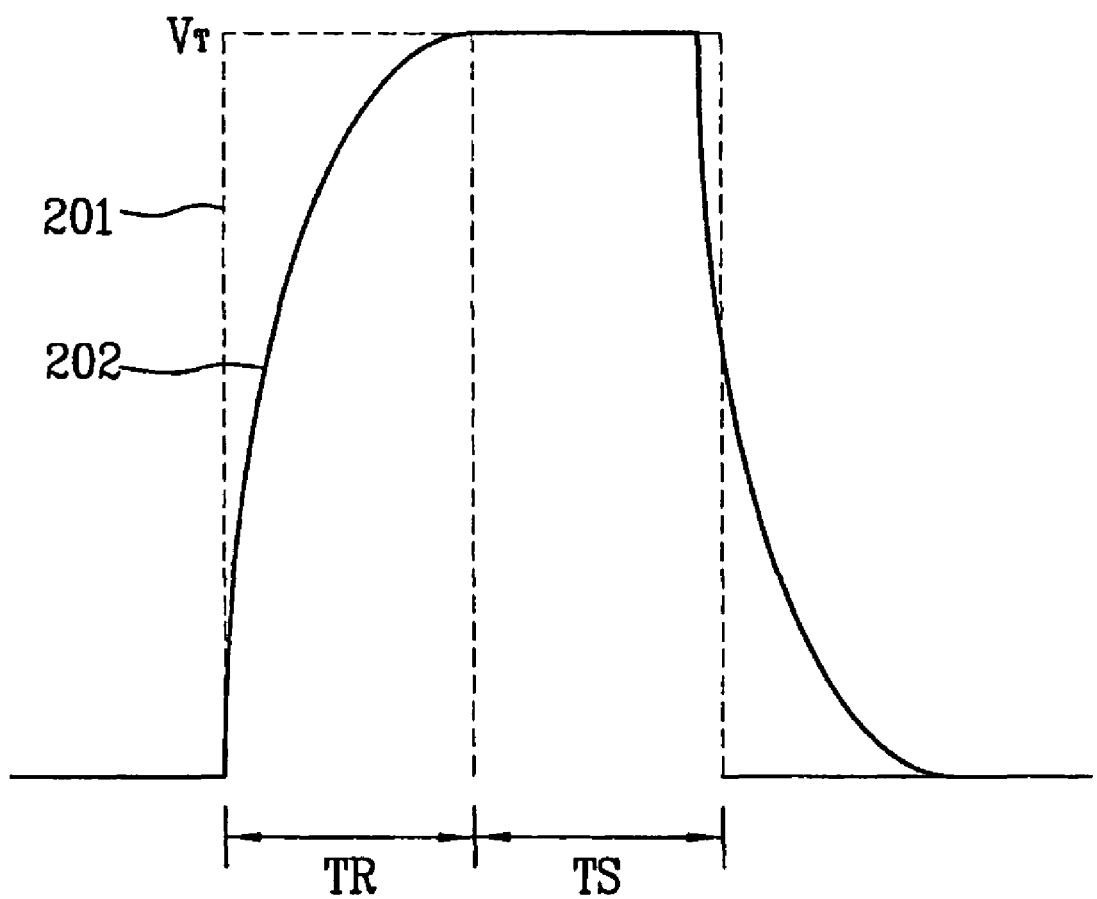
FIG. 2 is a waveform diagram illustrating waveforms of an ideal scan pulse and a distorted scan pulse.
Figure 3:
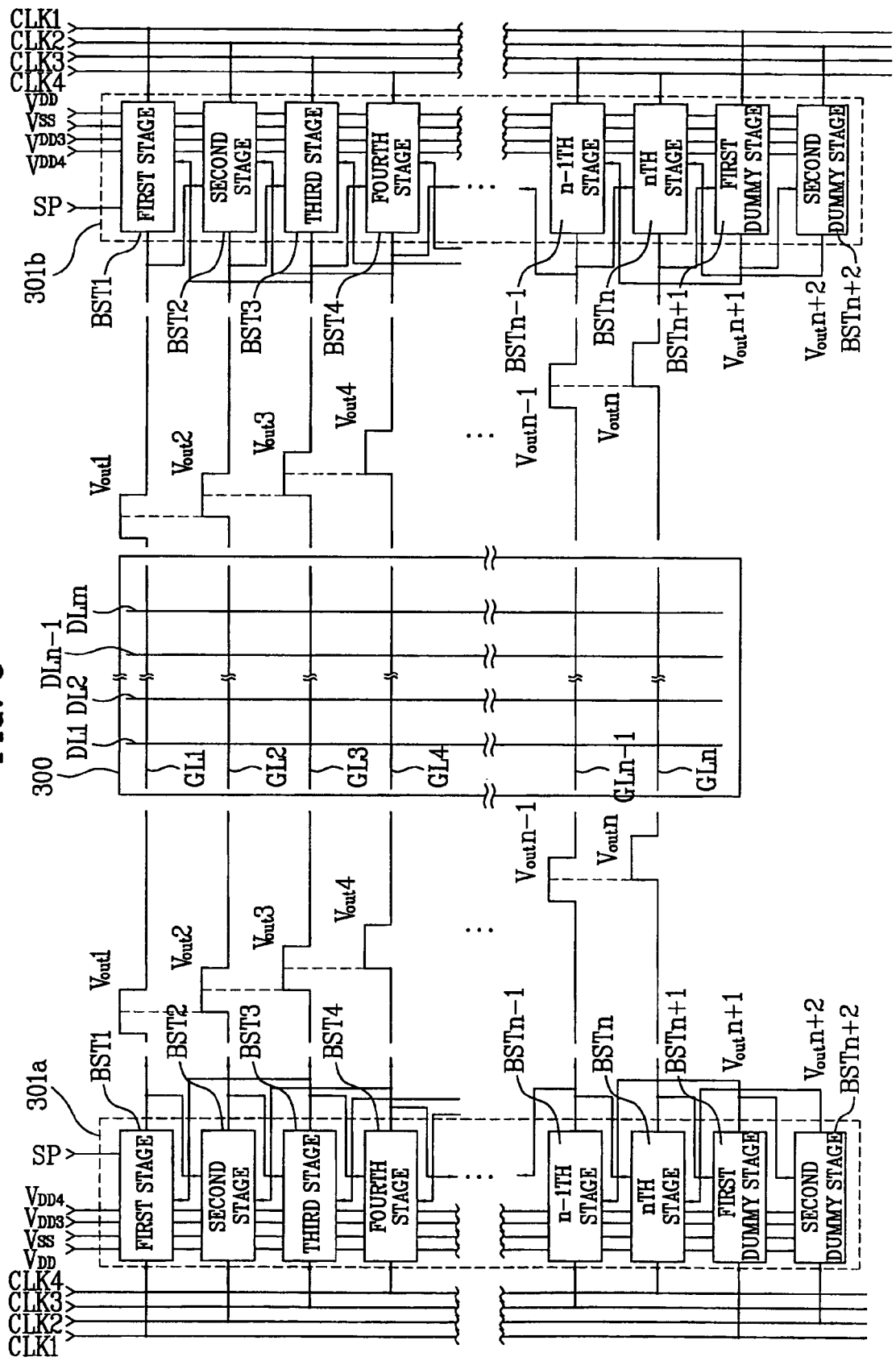
FIG. 3 is a block diagram illustrating a configuration of a shift register according to a first embodiment.

As shown in FIG. 3, the shift register according to the first embodiment, which may be incorporated in an LCD device, the shift register outputs a plurality of scan pulses Vout1 to Voutn to gate lines GL1 to GLn of an LCD panel 300 in a sequential manner in response to associated ones of clock pulses CLK1 to CLK4 and a start pulse SP, respectively, while increasing the pulse width of each of the scan pulses Vout1 to Voutn such that successive scan pulses Vout1 to Voutn are overlapped with each other for a predetermined time.

The shift register may be divided into two shift registers: namely, first and second shift registers 301a and 301b. The first shift register 301a, which is arranged at the left side of the LCD panel 300, supplies a scan pulse to one end of each of the gate lines GL1 to GLn. The second shift register 301b, which is arranged at the right side of the LCD panel 300, supplies a scan pulse to the other end of each of the gate lines GL1 to GLn.

In order to reduce the size of the display device, the first and second shift registers 301a and 301b may be incorporated into the LCD panel 300.

The LCD panel 300 includes a plurality of gate lines GL1 to GLn which extend in parallel in one direction, and a plurality of data lines DL1 to DLm which extend in parallel in a direction orthogonal to the gate lines GL1 to GLn. Each of the data lines DL1 to DLm may be charged with a data voltage output from the data driver. A TFT switch and a pixel electrode are formed at each pixel region defined by an associated one of the gate lines GL1 to GLn and an associated one of the data lines DL1 to DLm.

The TFT is formed near a region where the one of the gate lines GL1 to GLn and the associated one of the data lines DL1 to DLm cross each other. The TFT switches the data voltage charged in the associated one of the data lines DL1 to DLm in response to an associated one of the scan pulses Vout1 to Voutn charged in the associated one of the gate lines GL1 to GLn, to apply the data voltage to the associated pixel electrode. In this manner the pixels of an image may be displayed on the LCD panel 300.

The first shift register 301a includes n stages BST1 to BSTn, a first dummy stage BSTn+1, and a second dummy stage BSTn+2, which are connected in series. The stages BST1 to BSTn+2 output scan pulses Vout1 to Voutn+2, respectively, in a sequential manner from the stages BST1 to BSTn+2, starting from the first stage BST1, and ending at the second dummy stage BSTn+2. The scan pulses are sequentially supplied to the gate lines GL1 to GLn of the LCD panel 300 respectively, to cause the gate lines GL1 to GLn to be sequentially scanned.

The second shift register 301b has the same configuration as the first shift register 301a. Accordingly, the scan pulses Vout1 to Voutn+2 output from the stages BST1 to BSTn+2 of the first shift register 301a are identical to scan pulses Vout1 to Voutn+2 output from stages BST1 to BSTn+2 of the second shift register 301b, respectively. For example, the first scan pulse Vout1 output from the first stage BST1 of the first shift register 301a is supplied to the first gate line GL1 at the same time as the first scan pulse Vout1 output from the first stage BST1 of the second shift register 301b. Thus, the stages BST1 to BSTn+2 of the first shift register 301a correspond to the stages BST1 to BSTn+2 of the second shift register 301b such that they output the same scan pulses Vout1 to Voutn+2, respectively. However, each of the stages BST1 to BSTn included in the first shift register 301a applies the scan pulses Vout1 to Voutn to one end of an associated one of the gate lines GL1 to GLn, whereas each of the stages BST1 to BSTn included in the second shift register 301b applies an associated one of the scan pulses Vout1 to Voutn to the corresponding other end of the gate lines GL1 to GLn.

Each of the stages BST1 to BSTn+2 of the first shift register 301a receives first through fourth voltages VDD, VSS, VDD3, and VDD4, and one of first through fourth clock pulses CLK1 to CLK4 which arranged to have a phase difference between successive ones thereof. The first voltage VDD may be a DC voltage having a positive polarity, whereas the second voltage VSS may be a voltage having a negative polarity. Each of the third and fourth voltages VDD3 and VDD4 may be an AC voltage which may alternate in polarity on a frame-by-frame basis. The third and fourth voltages VDD3 and VDD4 have different polarities in the same frame.

The first stage BST1, which is arranged upstream from the remaining stages BST2 to BSTn in the first shift register 301a, receives a start pulse SP, in addition to the first through fourth voltages VDD, VSS, VDD3, and VDD4, and two of the first through fourth clock pulses CLK1 to CLK4.

As described above, the first through fourth clock pulses CLK1 to CLK4 are output after being time (phase)-delayed with respect one another. That is, the second clock pulse CLK2 is output after being time-delayed from the first clock pulse CLK1. The third clock pulse CLK3 is output after being time-delayed from the second clock pulse CLK2. The fourth clock pulse CLK4 is output after being time-delayed from the third clock pulse CLK3.

Start pulse SP, applied to the first stage BST1 in the first shift register 301a, is output earlier than the clock pulses CLK1 to CLK4. The start pulse SP is output once for each frame. That is, for each frame, the start pulse SP is first output, and then the first through fourth clock pulses CLK1 to CLK4 are sequentially output in a repetitive manner. Accordingly, the first clock pulse CLK1 is output in a period between the point of time when the fourth clock pulse CLK4 is output and the point of time when the second clock pulse CLK2 is output. The fourth clock pulse CLK4 may be output in synchronism with the start pulse SP. In this case, the fourth clock pulse CLK4 is output earlier than the first through third clock pulses CLK1 to CLK3.

The first shift register 301a may use two or more clock pulses. That is, the first shift register 301a may use only two of the first through fourth clock pulses CLK1 to CLK4, for example, the first and second clock pulses CLK1 and CLK2, or may use only three of the first through fourth clock pulses CLK1 to CLK4, for example, the first through third clock pulses CLK1 to CLK3. Alternatively, the first shift register 301a may use at least five clock pulses which are sequentially output.

The second shift register 301b has the same configuration as the first shift register 301a.

Since the first and second shift registers 301a and 301b operate in the same manner, the following description will be given only in conjunction with the first shift register 301a.

When a start pulse SP from the timing controller is first input to the first stage BST1, the first stage BST1 is enabled in response to the start pulse SP. Thereafter, the enabled first stage BST1 receives a first clock pulse CLK1 from the timing controller, and outputs the first clock pulse CLK1 as a first scan pulse Vout1. The first scan pulse Vout1 from the first stage BST1 is supplied to the first gate line GL1 and second stage BST2. In response to the first scan pulse Vout1, the second stage BST2 is enabled. Thereafter, the enabled second stage BST2 receives a second clock pulse CLK2 from the timing controller, and outputs the second clock pulse CLK2 as a second scan pulse Vout2. The second scan pulse Vout2 from the second stage BST2 is supplied to the second gate line GL2 and third stage BST3. In response to the second scan pulse Vout2, the third stage BST3 is enabled. Subsequently, the enabled third stage BST3 receives a third clock pulse CLK3 from the timing controller, and outputs the third clock pulse CLK3 as a third scan pulse Vout3. The third scan pulse Vout3 from the third stage BST3 is supplied to the third gate line GL3, fourth stage BST4, and first stage BST1. In response to the third scan pulse Vout3, the fourth stage BST4 is enabled. Also, the first stage BST1 supplies the third voltage VSS to the first gate line GL1 in response to the third scan pulse Vout3. Thereafter, the enabled fourth stage BST4 receives a fourth clock pulse CLK4 from the timing controller, and outputs the fourth clock pulse CLK4 as a fourth scan pulse Vout4. The fourth scan pulse Vout4 from the fourth stage BST4 is supplied to the fourth gate line GL4 and fifth stage BST5. In response to the fourth scan pulse Vout4, the fifth stage BST5 is enabled. The enabled fifth stage BST5 receives a first clock pulse CLK1 from the timing controller, and outputs the first clock pulse CLK1 as a fifth scan pulse Vout5. The fifth scan pulse Vout5 from the fifth stage BST5 is supplied to the fifth gate line GL5, sixth stage BST6, and third stage BST3. In response to the fifth scan pulse Vout5, the sixth stage BST6 is enabled. Also, the third stage BST3 supplies the third voltage VSS to the third gate line GL3 in response to the fifth scan pulse Vout5. In such a manner, sixth through n-th scan pulses Vout6 to Voutn are sequentially output from the sixth through n-th stages BST6 to BSTn, respectively. The sixth through n-th scan pulses Vout6 to Voutn are sequentially supplied to the sixth through n-th gate lines GL6 to GLn, respectively.

The scan pulses have a pulse width such that successive ones of the scan pulses are overlapped with each other for a predetermined width. In this example, the first dummy stage BSTn+1 supplies an n+1-th scan pulse Voutn+1 to the n−1-th stage BSTn−1, whereas the second dummy stage BSTn+2 functions to supply an n+2-th scan pulse Voutn+2 to the n-th stage BSTn. That is, the n+1-th and n+2-th scan pulses Voutn+1 and Voutn+2 output from the first and second dummy stages BSTn+1 and BSTn+2 are not supplied to any gate lines. The n+1-th and n+2-th scan pulses Voutn+1 and Voutn+2 function as dummy outputs for enabling the n−1-th and n-th stages BSTn−1 and BSTn to output the second voltage VSS, respectively.

Thus, the stages BST1 to BSTn output the scan pulses Vout1 to Voutn, to sequentially supply the scan pulses Vout1 to Voutn to the gate lines GL1 to GLn, respectively. At the same time, each of the stages BST1 to BSTn supplies an associated one of the scan pulses Vout1 to Voutn to the downstream stage to an enable the stage, equivalent to an individual start pulse SP. Each of the stages BST1 to BSTn supplies the second voltage VSS to the associated gate line in response to the scan pulse output from the downstream stage.

The second shift register 301b operates in the same manner as the first shift register 301a. However, each of the stages BST1 to BSTn included in the second shift register 301b supplies an associated one of the scan pulses Vout1 to Voutn to the other end of an associated one of the gate lines GL1 to GLn, Each of the stages BST1 to BSTn included in each of the first and second shift registers 301a and 301b does not receive the scan pulse output from the first downstream stage, but receives the scan pulse output from the second downstream stage.

Since the scan pulses Vout1 to Voutn have the same waveform, the following description will be given only in conjunction with the first through fourth scan pulses Vout1 to Vout4.

Figure 4:
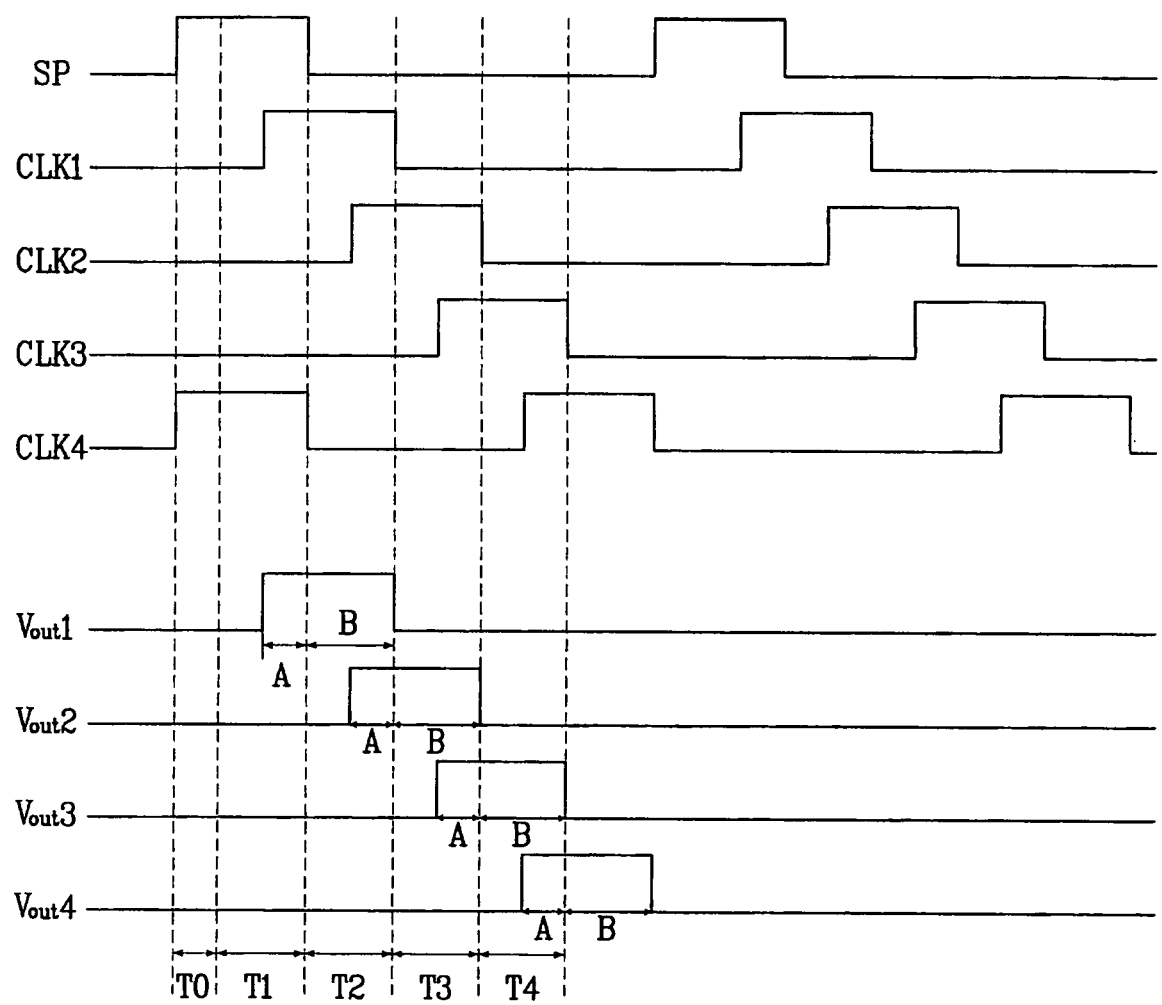
FIG. 4 is a timing diagram of first through fourth clock pulses and first through fourth scan pulses.

As shown in FIG. 4, each of the first through fourth scan pulses Vout1 to Vout4 may have a pulse width which may be divided into a pre-charging period A and an effective charging period B. The pre-charging period A of each of the scan pulses Vout1 to Vout4 is overlapped in time with the effective charging period B of the previous scan pulse. Also, the effective charging period B of each of the scan pulses Vout1 to Vout4 is overlapped in time with the pre-charging period A of the next scan pulse. Accordingly, each of the scan pulses Vout1 to Vout4 begins to be output in the effective charging period B of the previous scan pulse, and may reach a target voltage VT in the effective charging period B of the associated scan pulse.

The first scan pulse Vout1 begins to be output in one period of the start pulse SP corresponding to the pre-charging period A of the first scan pulse Vout1, and is maintained at the target voltage VT in the effective charging period B of the first scan pulse Vout1. The second scan pulse Vout2 begins to be output in the effective charging period B of the first scan pulse Vout1 corresponding to the pre-charging period A of the second scan pulse Vout2, and is maintained at the target voltage VT in the effective charging period B of the second scan pulse Vout2. The third scan pulse Vout3 begins to be output in the effective charging period B of the second scan pulse Vout2 corresponding to the pre-charging period A of the third scan pulse Vout3, and is maintained at the target voltage VT in the effective charging period B of the third scan pulse Vout3. The fourth scan pulse Vout4 begins to be output in the effective charging period B of the third scan pulse Vout3 corresponding to the pre-charging period A of the fourth scan pulse Vout4, and is maintained at the target voltage VT in the effective charging period B of the fourth scan pulse Vout4.

Thus, each of the scan pulses Vout1 to Vout4 has a pulse width larger than that of the conventional scan pulses by a pulse width corresponding to the pre-charging period A. Accordingly, the turn-on duration of the TFTs of the liquid crystal panel 300, which receive the scan pulses Vout1 to Vout4, is increased.

Since each of the scan pulses Vout1 to Vout4 is output in synchronism with an associated one of the first through fourth clock pulses CLK1 to CLK4, successive ones of the first through fourth clock pulses CLK1 to CLK4 are overlapped with each other by a predetermined time equal to that of the scan pulses Vout1 to Vout4.

Since the first through fourth clock pulses CLK1 to CLK4 are continuously repeated while maintaining a predetermined time difference between successive ones thereof, the first clock pulse CLK1 is overlapped with the fourth clock pulse CLK4.

Figure 5:
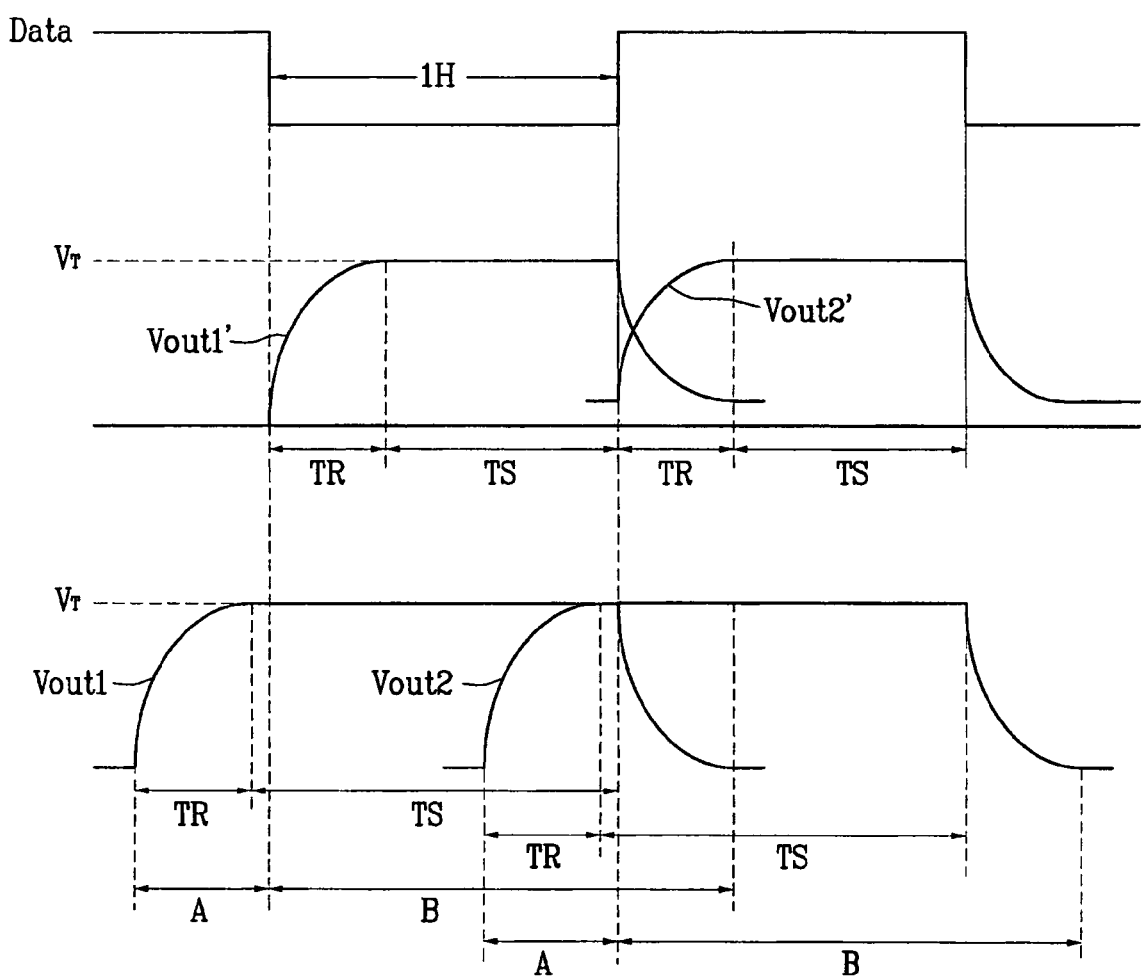
FIG. 5 is a waveform diagram explaining comparison of scan pulses with conventional scan pulses.
Figure 6:
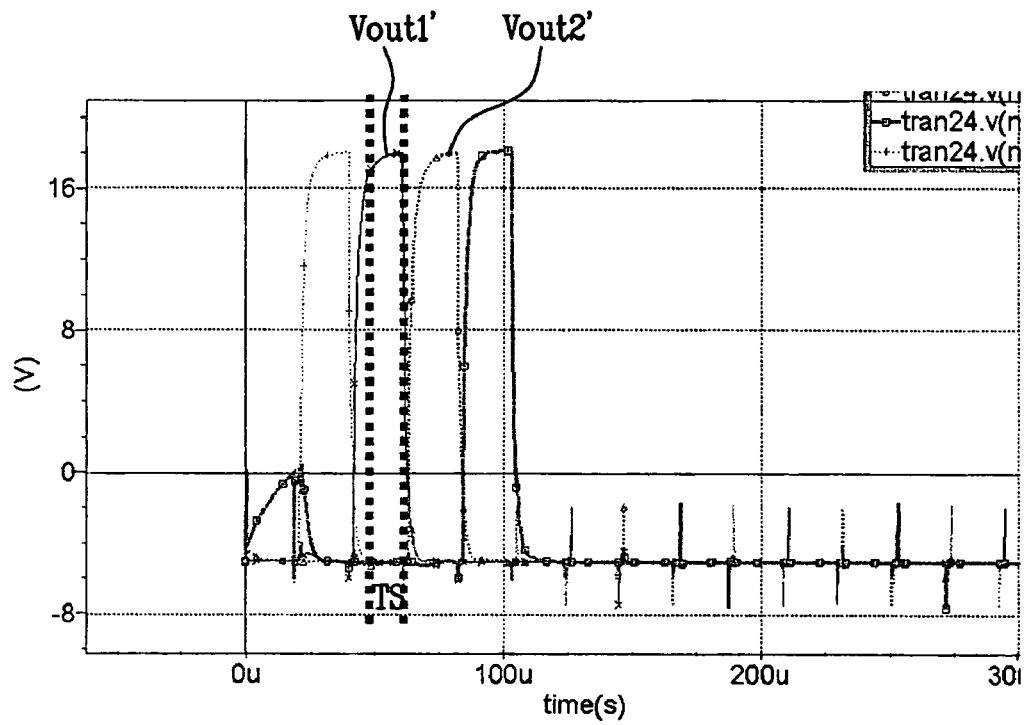
FIGS. 6A and 6B are waveform diagrams illustrating simulated waveforms of the scan pulses and simulated waveforms of the conventional scan pulses, respectively.
Figure 6:
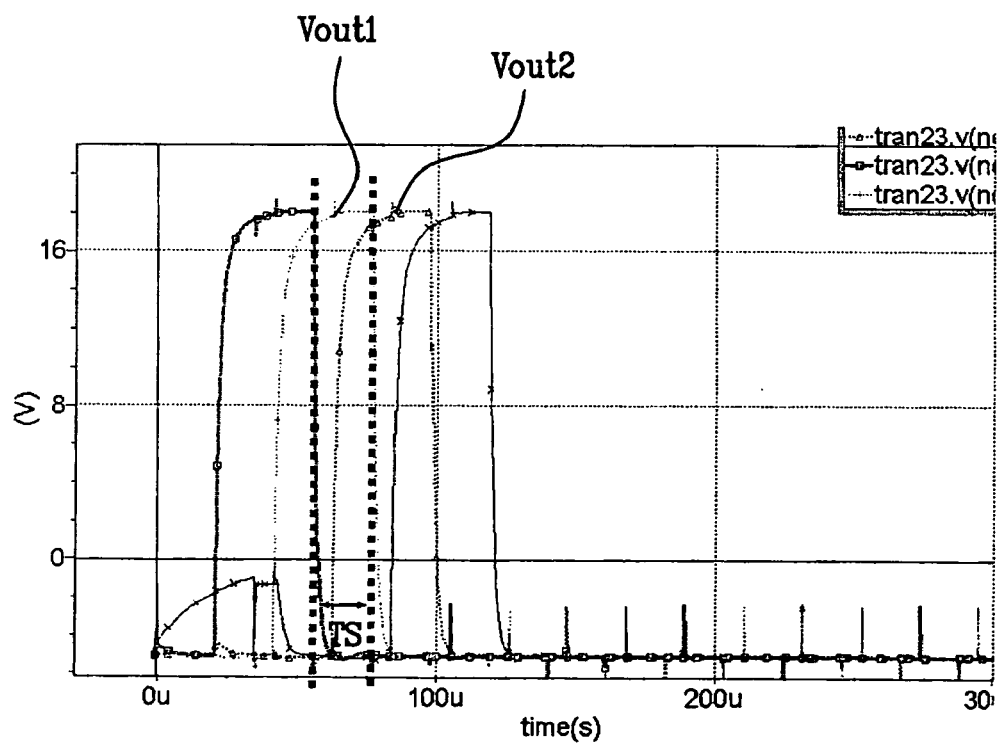

FIG. 5 is a waveform diagram comparing the scan pulses according to the present example with the conventional scan pulses. FIGS. 6A and 6B are waveform diagrams illustrating simulated waveforms of the scan pulses according to the present example and simulated waveforms of the conventional scan pulses, respectively.

When the waveforms of the conventional scan pulses Vout1' and Vout2' are distorted by resistance and capacitance components of the associated gate lines, the rise time TR of the conventional scan pulses Vout1' and Vout2' is increased. As a result, the effective charging time TS of the conventional scan pulses Vout1' and Vout2', for which the scan pulses are maintained at a target voltage VT, is shortened. Meanwhile, a data voltage Data is applied to each data line while being periodically varied in polarity between positive and negative polarities. In this case, the effective charging time TS of the scan pulses is shorter than the time 1H, for which the data voltage Data is maintained at a positive polarity state, or for which the data voltage Data is maintained at a negative polarity state.

In the present example, however, the first scan pulse Vout1 begins to be output at a time within the period of the start pulse SP (corresponding to the pre-charging period A of the first scan pulse Vout1), and reaches a target voltage VT after being gradually increased in voltage. Thereafter, the first scan pulse Vout1 is maintained at the target voltage VT for a time corresponding to the effective charging period B of the first scan pulse Vout1. That is, the rise time TR of the first scan pulse Vout1 is not included in the time corresponding to the effective charging period B of the first scan pulse Vout1, but is included in the time corresponding to the pre-charging period A of the first scan pulse Vout1. Accordingly, the time corresponding to the effective charging time B of the first scan pulse Vout1 is not reduced by the rise time TR. Similarly, the second scan pulse Vout2 begins to be output a time within the effective charging period B of the first scan pulse Vout1 (corresponding to the pre-charging period A of the second scan pulse Vout2), and reaches the target voltage VT after being gradually increased in voltage. Thereafter, the second scan pulse Vout2 is maintained at the target voltage VT for a time corresponding to the effective charging period B of the second scan pulse Vout2. That is, the rise time TR of the second scan pulse Vout2 is not included in the time corresponding to the effective charging period B of the second scan pulse Vout2, but is included in the time corresponding to the pre-charging period A of the second scan pulse Vout2. Accordingly, the time corresponding to the effective charging time B of the second scan pulse Vout2 is not reduced by the rise time TR.

As shown in FIGS. 6A and 6B, the first and second scan pulses of the present example Vout1 and Vout2 have an effective charging time TS longer than that of the conventional first and second scan pulses Vout1' and Vout2'. Since the effective charging time TS of the first and second scan pulses Vout1 and Vout2 according to the present invention is longer than the time 1H, for which the data voltage Data is maintained at a positive or negative polarity state, the data voltage Data can be effectively transferred to the associated pixel electrodes.

Since successive ones of the scan pulses Vout1 to Voutn have an overlapping pulse width period, there may be a problem occurring when each of the stages BST1 to BSTn+2 receives a scan pulse from the next downstream stage. For example, if the second scan pulse Vout2 output from the second stage BST2 is input to the first stage BST1, as in the conventional arrangement, the first stage BST1, which outputs the first scan pulse Vout1, supplies the second voltage VSS to the first gate line GL1 at a time within the effective charging period B of the first scan pulse Vout1 because the first and second scan pulses Vout1 and Vout2, which are successively output, have an overlapping pulse width period. Tha is, the first stage BST1 supplies the second voltage VSS to the first gate line GL1 at the time when the second scan pulse Vout2 is output (that is, a time within the pre-charging period A of the second scan pulse Vout2) before the first scan pulse Vout1 is completely applied to the first gate line GL1. Accordingly, the first stage BST1 may output an incomplete scan pulse. To avoid this, each of the stages BST1 to BSTn+2 does not, but receives a scan pulse from the second downstream stage rather than the next downstream stage. Thus, each of the stages BST1 to BSTn+2 receives a scan pulse from a downstream stage which does not overlap with the scan pulse output from the stage itself.

Since the stages BST1 to BSTn+2 included in the first and second shift registers 301a and 301b have the same configuration, a detailed description of, for example, the third stage BST3 included in the first shift register 301a is representative.

Figure 7:
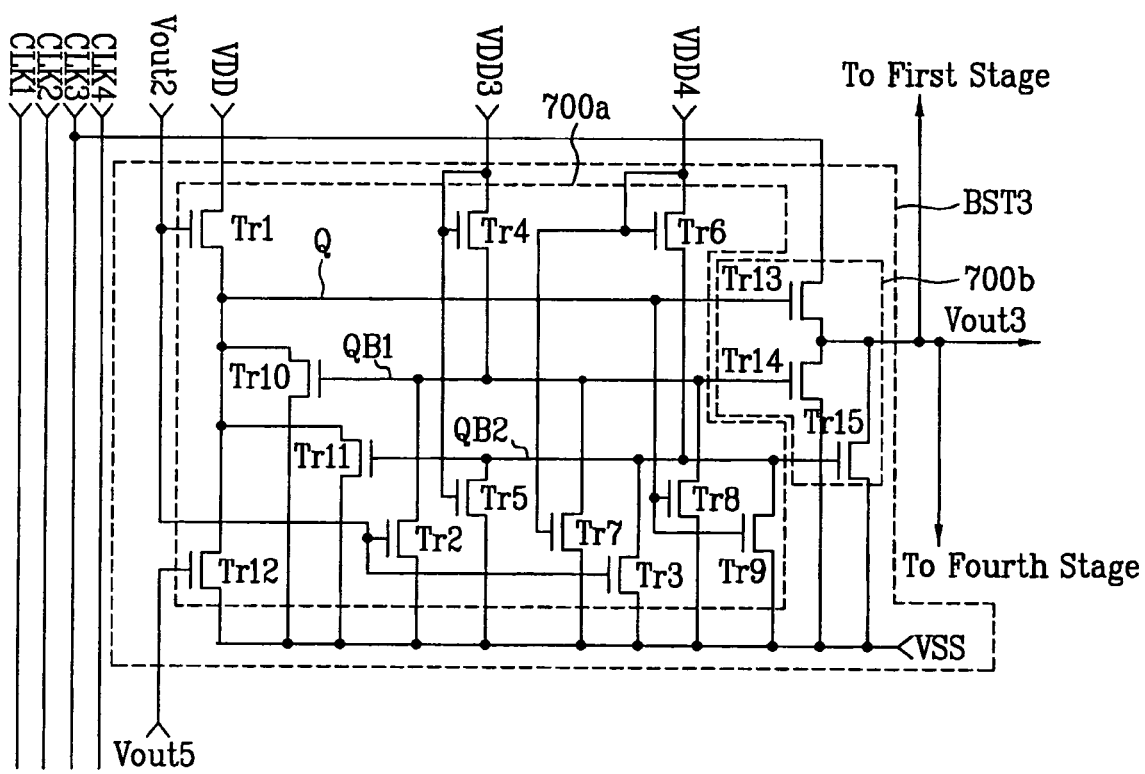
FIG. 7 is a circuit diagram illustrating a circuit included in a third stage of a first shift register shown in FIG. 3.

As shown in FIG. 7, the third stage BST3 includes a node controller 700a which controls charging and discharging operations for first, second, and third nodes Q, QB1, and QB2, and an output unit 700b which is turned on in accordance with states of the first, second, and third nodes Q, QB1, and QB2, to selectively output a scan pulse or the second voltage VSS. The first, second, and third nodes Q, QB1, and QB2 are selectively charged or discharged. When the first node Q is in a charging state, both the second and third nodes QB1 and QB2 are maintained in a discharging state. On the other hand, when the first node Q is in a discharging state, one of the second and third nodes QB1 and QB2 is maintained in a charging state. That is, when the first node Q is in a discharging state in an odd-numbered frame, the second node QB1 is charged, whereas the third node QB2 is discharged. On the other hand, when the first node Q is in a discharging state in an even-numbered frame, the second node QB1 is discharged, whereas the third node QB2 is charged. VDD3 and VDD4, which have opposite polarities, and are alternately varied in polarity on a frame basis, are applied to the second and third nodes QB1 and QB2 (charging and discharging), respectively, when the first node Q is in a discharging state, to prevent a degradation of switching elements connected, at gate terminals thereof, to the second and third nodes QB1 and QB2.

The node controller 700a of the third stage BST3 includes first through twelfth NMOS transistors Tr1 to Tr12. The first NMOS transistor Tr1 charges the first node Q with the first voltage VDD in response to a scan pulse from the stage arranged first upstream from the third stage BST3. That is, the first NMOS transistor Tr1 charges the first node Q with the first voltage VDD in response to the second scan pulse Vout2 from the second stage BST2. For this operation, the gate terminal of first NMOS transistor Tr1 is connected, to the second stage BST2; and is also, the source terminal is connected to a power line for transferring the first voltage VDD; and, the drain terminal is connected to the first node Q.

The second NMOS transistor Tr2 discharges the second node QB1 with the second voltage VSS in response to a scan pulse from the stage arranged first upstream from the third stage BST3. That is, the second NMOS transistor Tr2 discharges the second node QB1 with the second voltage VSS in response to the second scan pulse Vout2 from the second stage BST2. For this operation, the gate terminal of the second NMOS transistor Tr2 is connected to the second stage BST2; the source terminal is connected to the second node QB1; and, the drain terminal is connected to a power line for transferring the second voltage VSS.

The third NMOS transistor Tr3 discharges the third node QB2 with the second voltage VSS in response to a scan pulse from the stage arranged first upstream from the third stage BST3. That is, the third NMOS transistor Tr3 discharges the third node QB2 with the second voltage VSS in response to the second scan pulse Vout2 from the second stage BST2. For this operation, the gate terminal of the third NMOS transistor Tr3 is connected to the second stage BST2; the source terminal is connected to the third node QB2; and, the drain terminal is connected to the power line for transferring the second voltage VSS.

The fourth NMOS transistor Tr4 is turned on or off in response to the third voltage VDD3. In an ON state thereof, the fourth NMOS transistor Tr4 charges the second node QB1 with the third voltage VDD3. For this operation, the gate and source terminals of the fourth NMOS transistor Tr4 are connected to a power line for transferring the third voltage VDD3; and the drain terminal is connected to the second node QB1. The third voltage VDD3 is an AC voltage which has a polarity alternating between positive and negative polarities on a frame-by-frame basis. That is, the third voltage VDD3 has a positive polarity in odd frames, and has a negative polarity in even frames.

The fifth NMOS transistor Tr5 discharges the third node QB2 with the second voltage VSS in response to the third voltage VDD3. For this operation, the gate terminal of the fifth NMOS transistor Tr5 is connected to the power line for transferring the third voltage VDD3; the source is connected to the third node QB2, and the drain terminal drain terminal is connected to the power line for transferring the second voltage VSS.

The sixth NMOS transistor Tr6 is turned on or off in response to the fourth voltage VDD4. In an ON state thereof, the sixth NMOS transistor Tr6 charges the third node QB2 with the fourth voltage VDD4. For this operation, the the gate and source terminals of the sixth NMOS transistor Tr6 are connected, to a power line for transferring the fourth voltage VDD4; and the drain terminal is connected to the third node QB2. The fourth voltage VDD4 is an AC voltage which has a polarity alternating between positive and negative polarities on a frame-by-frame basis. That is, the fourth voltage VDD4 has a negative polarity in odd frames, and has a positive polarity in even frames.

The seventh NMOS transistor Tr7 discharges the second node QB1 with the second voltage VSS in response to the fourth voltage VDD4. For this operation, the gate terminal of the seventh NMOS transistor Tr7 is connected to the power line for transferring the fourth voltage VDD4; the source terminal is connected to the second node QB1; and the drain terminal is connected, to the power line for transferring the second voltage VSS.

The eighth NMOS transistor Tr8 discharges the second node QB1 with the second voltage VSS in response to the first voltage VDD charged in the first node Q. For this operation, the gate terminal of the eighth NMOS transistor Tr8 is connected to the first node Q; the source terminal is connected to the second node QB1; and, the drain terminal is connected the power line for transferring the second voltage VSS.

The ninth NMOS transistor Tr9 discharges the third node QB2 with the second voltage VSS in response to the first voltage VDD charged in the first node Q. For this operation, the gate terminal of the ninth NMOS transistor Tr9 is connected to the first node Q; the source terminal is connected to the third node QB2; and, the drain terminal is connected to the power line for transferring the second voltage VSS.

The tenth NMOS transistor Tr10 discharges the first node Q with the second voltage VSS in response to the third voltage VDD3 charged in the second node QB1. For this operation, the gate terminal of the tenth NMOS transistor Tr10 is connected to the second node QB1; the source terminal is connected to the first node Q; and, the drain terminal is connected to the power line for transferring the second voltage VSS.

The eleventh NMOS transistor Tr11 discharges the first node Q with the second voltage VSS in response to the fourth voltage VDD4 charged in the third node QB2. For this operation, the gate terminal of the eleventh NMOS transistor Tr11 is connected to the third node QB2; the source terminal is connected, to the first node Q, and is connected, at a drain terminal thereof, to the power line for transferring the second voltage VSS.

The twelfth NMOS transistor Tr12 discharges the first node Q with the second voltage VSS in response to a scan pulse from the stage arranged second downstream from the third stage BST3. That is, the twelfth NMOS transistor Tr12 discharges the first node Q with the second voltage VSS in response to the fifth scan pulse Vout5 from the fifth stage BST5. For this operation, the gate terminal of the twelfth NMOS transistor Tr12 is connected to the output unit of the fifth stage BST5; source terminal is connected to the first node Q; and the drain terminal is connected to the power line for transferring the second voltage VSS.

The output unit 700b of the third stage BST3 includes thirteenth through fifteenth NMOS transistors Tr13 to Tr15.

The thirteenth NMOS transistor Tr13 outputs a clock pulse to the associated gate line as a scan pulse, in response to the first voltage VDD charged in the first node Q. The scan pulse is supplied to both the second upstream stage and the first downstream stage. For this operation, the gate terminal of the thirteenth NMOS transistor Tr13 is connected, to the first node Q; the source terminal is connected, to a clock line for transferring the third clock pulse CLK3; and, the drain terminal is connected, to the third gate line, the gate terminal of the twelfth NMOS transistor Tr12 in the first stage BST1, and the gate terminals of the first through third NMOS transistors Tr1 to Tr3 in the fourth stage BST4.

The fourteenth NMOS transistor Tr14 outputs the second voltage VSS to the associated gate line in response to the third voltage VDD3 charged in the second node QB1. That is, the fourteenth NMOS transistor Tr14 supplies the second voltage VSS to the third gate line in response to the third voltage VDD3 charged in the second node QB1. For this operation, the gate terminal of the fourteenth NMOS transistor Tr14 is connected to the second node QB1; the drain terminal is connected to the power line for transferring the second voltage VSS; and, the source terminal is connected, to the third gate line, the gate terminal of the twelfth NMOS transistor Tr12 in the first stage BST1, and the gate terminals of the first through third NMOS transistors Tr1 to Tr3 in the fourth stage BST4.

The fifteenth NMOS transistor Tr15 outputs the second voltage VSS to the associated gate line in response to the fourth voltage VDD4 charged in the third node QB2. That is, the fifteenth NMOS transistor Tr15 supplies the second voltage VSS to the third gate line in response to the fourth voltage VDD4 charged in the third node QB2. For this operation, the gate terminal of the fifteenth NMOS transistor Tr15 is connected to the second node QB1; the drain terminal is connected to the power line for transferring the second voltage VSS; and, the source terminal is connected to the third gate line, the gate terminal of the twelfth NMOS transistor Tr12 in the first stage BST1, and the gate terminals of the first through third NMOS transistors Tr1 to Tr3 in the fourth stage BST4.

The first and second stages BST1 and BST2, fourth through n-th stages BST4 to BSTn, and first and second dummy stages BSTn+1 and BSTn+2 have the same configuration as the third stage BST3.

Since there is no stage upstream from the first stage BST1, the first through third NMOS transistors Tr1 to Tr3 of the first stage BST1 receive a start pulse SP from the timing controller. That is, the first NMOS transistor Tr1 of the first stage BST1 charges the first node Q of the first stage BST1 with the first voltage VDD in response to the start pulse SP from the timing controller.

The second NMOS transistor Tr2 of the first stage BST1 discharges the second node QB1 of the first stage BST1 with the second voltage VSS in response to the start pulse SP from the timing controller. The third NMOS transistor Tr3 of the first stage BST1 discharges the third node QB2 of the first stage BST1 with the second voltage VSS in response to the start pulse SP from the timing controller.

There is no stage arranged second upstream from the first stage BST1 or second stage BST2. For this reason, the first stage BST1 supplies the first scan pulse Vout1 output therefrom to the first gate line and second stage BST2. Similarly, the second stage BST2 supplies the second scan pulse Vout2 output therefrom to the second gate line and third stage BST3.

There is no stage arranged first downstream from the second dummy stage BSTn+2. Accordingly, the source terminal of the thirteenth NMOS transistor Tr13, the drain terminal of the fourteenth NMOS transistor Tr14, and the drain terminal of the fifteenth NMOS transistor Tr15 in the second dummy stage BSTn+2 are connected to the gate terminal of the twelfth NMOS transistor Tr12 of the n-th stage BSTn.

The stages BST1 to BSTn+2 of the second shift register 301b have the same configuration as the stages BST1 to BSTn+2 of the first shift register 301a.

Since the first and second shift registers 301b operate in the same manner, the following description will be given only in conjunction with operation of the first shift register 301a.

Figure 8:
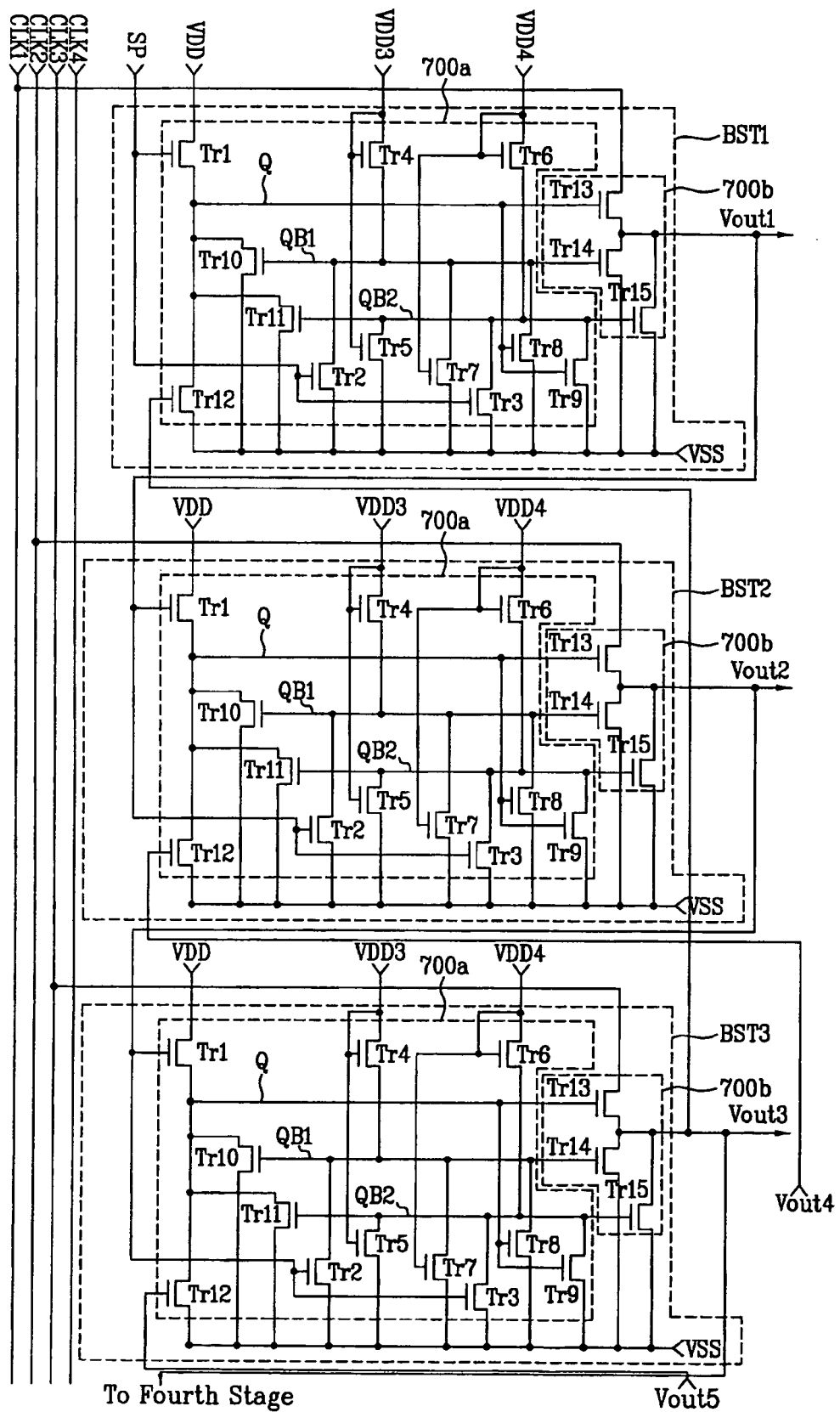
FIG. 8 is a circuit diagram illustrating first through third stages of the first shift register, each of which has a circuit configuration shown in FIG. 7.

FIG. 8 is a circuit diagram illustrating the first through third stages of the first shift register, each of which has the circuit configuration shown in FIG. 7.

In the following description, it is assumed that, in a first frame, the third voltage VDD3 is maintained in a positive polarity state, and the fourth voltage VDD4 is maintained in a negative polarity state. It is also assumed that, in a second frame, the third voltage VDD3 is maintained in a negative polarity state, and the fourth voltage VDD4 is maintained in a positive polarity state. That is, in odd-numbered frames, the third voltage VDD3 is maintained in a positive polarity state, and the fourth voltage VDD4 is maintained in a negative polarity state, whereas, in even-numbered frames, the third voltage VDD3 is maintained in a negative polarity state, and the fourth voltage VDD4 is maintained in a positive polarity state.

A start pulse SP is applied to the gate terminals of the first through third NMOS transistors Tr1 to Tr3. As a result, the first through third NMOS transistors Tr1 to Tr3 are turned on.

The first voltage VDD is supplied to the first node Q via the turned-on first NMOS transistor Tr1. As the first node Q is charged with the first voltage VDD, the eighth, ninth, and thirteenth NMOS transistors Tr8, Tr9, and Tr13, each of which is connected, at the gate terminal thereof, to the first node Q, are simultaneously turned on. Accordingly, the second voltage VSS is supplied to the second node QB1 via the turned-on eighth and second NMOS transistors Tr8 and Tr2. Thus, the second node QB1 is maintained in a discharging state. As a result, the tenth and fourteenth transistors Tr10 and Tr14, each of which is connected, at the gate terminal thereof, to the second node QB1, are turned off.

The second voltage VSS is supplied to the third node QB2 via the turned-on third and ninth NMOS transistors Tr3 and Tr9. As the third node QB2 is discharged with the second voltage VSS, the eleventh and fifteenth transistors Tr11 and Tr15, each of which is connected, at the gate terminal thereof, to the third node QB2, are turned off.

As the third voltage VDD3 is applied to the gate terminal of the fourth NMOS transistor Tr4, the fourth NMOS transistor Tr4 is turned on. Since the third voltage VDD3 is maintained in a positive polarity state during the first frame, the fourth NMOS transistor Tr4 is maintained in an ON state during the first frame. The third voltage VDD3 is supplied to the second node QB1 via the turned-on fourth NMOS transistor Tr4. Thus, both the second voltage VSS and the third voltage VDD3 are supplied to the second node QB1. However, the second node QB1 is maintained at the second voltage VSS because the number of transistors supplying the second voltage VSS is larger than the number of transistors supplying the third voltage VDD3. For this reason, the second node QB1 is maintained in a discharging state. As a result, the tenth and fourteenth NMOS transistors Tr10 and Tr14, each of which is connected, at the gate terminal thereof, to the second node QB1, are turned off.

The third voltage VDD3 is also supplied to the gate terminal of the fifth NMOS transistor Tr5. Accordingly, the fifth NMOS transistor Tr5 is maintained in an ON state during the first frame. The second voltage VSS is supplied to the third node QB2 via the turned-on fifth NMOS transistor Tr5. Thus, the third node QB2 is maintained in a discharging state by the third, fifth, and ninth NMOS transistors Tr3, Tr5, and Tr9. Accordingly, the eleventh and fifteenth NMOS transistors Tr11 and Tr15, each of which is connected, at the gate terminal thereof, to the third node QB2, are turned off.

As the fourth voltage VDD4 is applied to the gate terminal of the sixth NMOS transistor Tr6, the sixth NMOS transistor Tr6 is turned off. Since the fourth voltage VDD4 is maintained in a negative polarity state during the first frame, the sixth NMOS transistor Tr6 is maintained in an OFF state during the first frame.

The fourth voltage VDD4 is also supplied to the gate terminal of the seventh NMOS transistor Tr7. Accordingly, the seventh NMOS transistor Tr7 is maintained in an OFF state during the first frame.

As the first node Q of the first stage BST1 is charged with the first voltage VDD, and the second and third nodes QB1 and QB2 are discharged with the second voltage VSS, in accordance with the start pulse SP, the first stage BST1 is enabled.

When a first clock pulse CLK1 is supplied to the thirteenth NMOS transistor Tr13 of the first stage BST1 in the above-described state, the thirteenth NMOS transistor Tr13 outputs the first clock pulse CLK1 as the first scan pulse Vout1. In this case, the first scan pulse Vout1 is output while being overlapped with the start pulse SP because the first clock pulse CLK1 is overlapped with the start pulse SP.

The first scan pulse Vout1 is supplied to the first gate line and second stage BST2. That is, the first scan pulse Vout1 from the first stage BST1 is supplied to the first, second, and third NMOS transistors Tr1, Tr2, and Tr3 of the second stage BST2. As a result, the first node Q of the second stage BST2 is charged, whereas the second and third nodes QB1 and QB2 of the second stage BST2 are discharged. That is, the second stage BST2 is enabled by the first scan pulse Vout1. In other words, the second stage BST2 is enabled by the first scan pulse Vout1, similarly to the first stage BST1 which is enabled by the start pulse SP. When a second clock pulse CLK2 is supplied to the thirteenth NMOS transistor Tr13 of the second stage BST2 in the above-described state, the thirteenth NMOS transistor Tr13 outputs the second clock pulse CLK2 as the second scan pulse Vout2. In this case, the second scan pulse Vout2 is output while being overlapped with the first scan pulse Vout1 because the second clock pulse CLK2 is overlapped with the first clock pulse CLK1.

The second scan pulse Vout2 is supplied to the second gate line and third stage BST3. That is, the second scan pulse Vout2 from the second stage BST2 is supplied to the first, second, and third NMOS transistors Tr1, Tr2, and Tr3 of the third stage BST3. As a result, the first node Q of the third stage BST3 is charged, whereas the second and third nodes QB1 and QB2 of the third stage BST3 are discharged. That is, the third stage BST3 is enabled by the second scan pulse Vout2. In other words, the third stage BST3 is enabled by the second scan pulse Vout2, similarly to the first stage BST1 which is enabled by the start pulse SP.

When a third clock pulse CLK3 is supplied to the thirteenth NMOS transistor Tr13 of the third stage BST3 in the above-described state, the thirteenth NMOS transistor Tr13 outputs the third clock pulse CLK3 as the third scan pulse Vout3. In this case, the third scan pulse Vout3 is output while being overlapped with the second scan pulse Vout2 because the third clock pulse CLK3 is overlapped with the second clock pulse CLK2.

The third scan pulse Vout3 is supplied to the third gate line and fourth stage BST4. That is, the third scan pulse Vout3 from the third stage BST3 is supplied to the first, second, and third NMOS transistors Tr1, Tr2, and Tr3 of the fourth stage BST4. As a result, the first node Q of the fourth stage BST4 is charged, whereas the second and third nodes QB1 and QB2 of the fourth stage BST4 are discharged. That is, the fourth stage BST4 is enabled by the third scan pulse Vout3. In other words, the fourth stage BST4 is enabled by the third scan pulse Vout3, similarly to the first stage BST1 which is enabled by the start pulse SP.

When a fourth clock pulse CLK4 is supplied to the thirteenth NMOS transistor Tr13 of the fourth stage BST4 in the above-described state, the thirteenth NMOS transistor Tr13 outputs the fourth clock pulse CLK4 as the fourth scan pulse Vout4. In this case, the fourth scan pulse Vout4 is output while being overlapped with the third scan pulse Vout3 because the fourth clock pulse CLK4 is overlapped with the third clock pulse CLK3.

Meanwhile, the third scan pulse Vout3 output from the third stage BST3 is also supplied to the twelfth NMOS transistor Tr12 of the first stage BST1. That is, the third scan pulse Vout3 is supplied to the gate terminal of the twelfth NMOS transistor Tr12 in the first stage BST1. As a result, the first stage BST1 is disabled.

In detail, the third scan pulse Vout3 turns on the twelfth NMOS transistor Tr12 of the first stage BST1. Accordingly, the second voltage VSS is supplied to the first node Q of the first stage BST1 via the turned-on twelfth NMOS transistor Tr12. Thus, the first node Q of the first stage BST1 is discharged. As a result, the eighth, ninth, and thirteenth NMOS transistors Tr8, Tr9, and Tr13 connected to the first node Q of the first stage BST1 are turned off. Also, as the start pulse SP is transited to a low-level state, the first, second, and third NMOS transistors Tr1, Tr2, and Tr3 of the first stage BST1, which receive the low-level start pulse SP, are turned off.

Since the second and eighth NMOS transistors Tr2 and Tr8 of the first stage BST1 are in an OFF state, as described above, the second node QB1 of the first stage BST1 is charged with the first voltage VDD supplied via the fourth NMOS transistor Tr4. Accordingly, the tenth and fourteenth NMOS transistors Tr10 and Tr14, each of which is connected, at the gate terminal thereof, to the second node QB1 of the first stage BST1, are turned on. As a result, the second voltage VSS is supplied to the first gate line via the turned-on fourteenth NMOS transistor Tr14.

The second voltage VSS is also supplied to the first node Q via the turned-on tenth NMOS transistor Tr10. As a result, the first node Q of the first stage BST1 is discharged by the tenth and twelfth NMOS transistors Tr10 and Tr12.

Thus, by the third scan pulse Vout3 from the third stage BST3, the first and third nodes Q and QB2 of the first stage BST1 are discharged, whereas the second node QB1 of the first stage BST1 is charged. That is, the first stage BST1 is disabled in response to the third scan pulse Vout3 from the third stage BST3. The disabled first stage BST1 outputs the second voltage VSS via the fourteenth NMOS transistor Tr14 included in the first stage BST1, to supply the second voltage VSS to the first gate line.

In the above-described manner, each of the stages BST1 to BSTn+2 is enabled by the scan pulse output from the first upstream stage, and is disabled by the scan pulse output from the second downstream stage.

Meanwhile, in the second frame, the third voltage VDD3 is maintained in a negative polarity state, whereas the fourth voltage VDD4 is in a positive polarity state. Accordingly, when each of the stages BST1 to BSTn+2 is disabled, the second node QB1 of the stage is discharged, whereas the third node QB2 of the stage is charged. That is, when each of the stages BST1 to BSTn+2 is disabled, the second voltage VSS is output via the fifteenth NMOS transistor Tr15 connected, at the gate terminal thereof, to the third node QB2. Thus, the second and third nodes QB1 and QB2 are alternately charged and discharged on a frame-by-frame basis, thereby preventing the fourteenth and fifteenth transistors Tr14 and Tr15 included in the output unit 700b from being degraded.

The stages BST1 to BSTn+2 of the second shift register 301b operate in the same manner as the stages BST1 to BSTn+2 of the first shift register 301a, respectively. Each of the stages BST1 to BSTn+2 in the first shift register 301a apply an associated one of scan pulses Vout1 to Voutn to one end of an associated one of the gate lines GL1 to GLn, whereas each of the stages BST1 to BSTn+2 in the second shift register 301b apply an associated one of scan pulses Vout1 to Voutn to the other end of an associated one of the gate lines GL1 to GLn.

Meanwhile, the stages BST1 to BSTn+2 of the first and second shift registers 301a and 301b may have the following circuit configurations.

Figure 9:
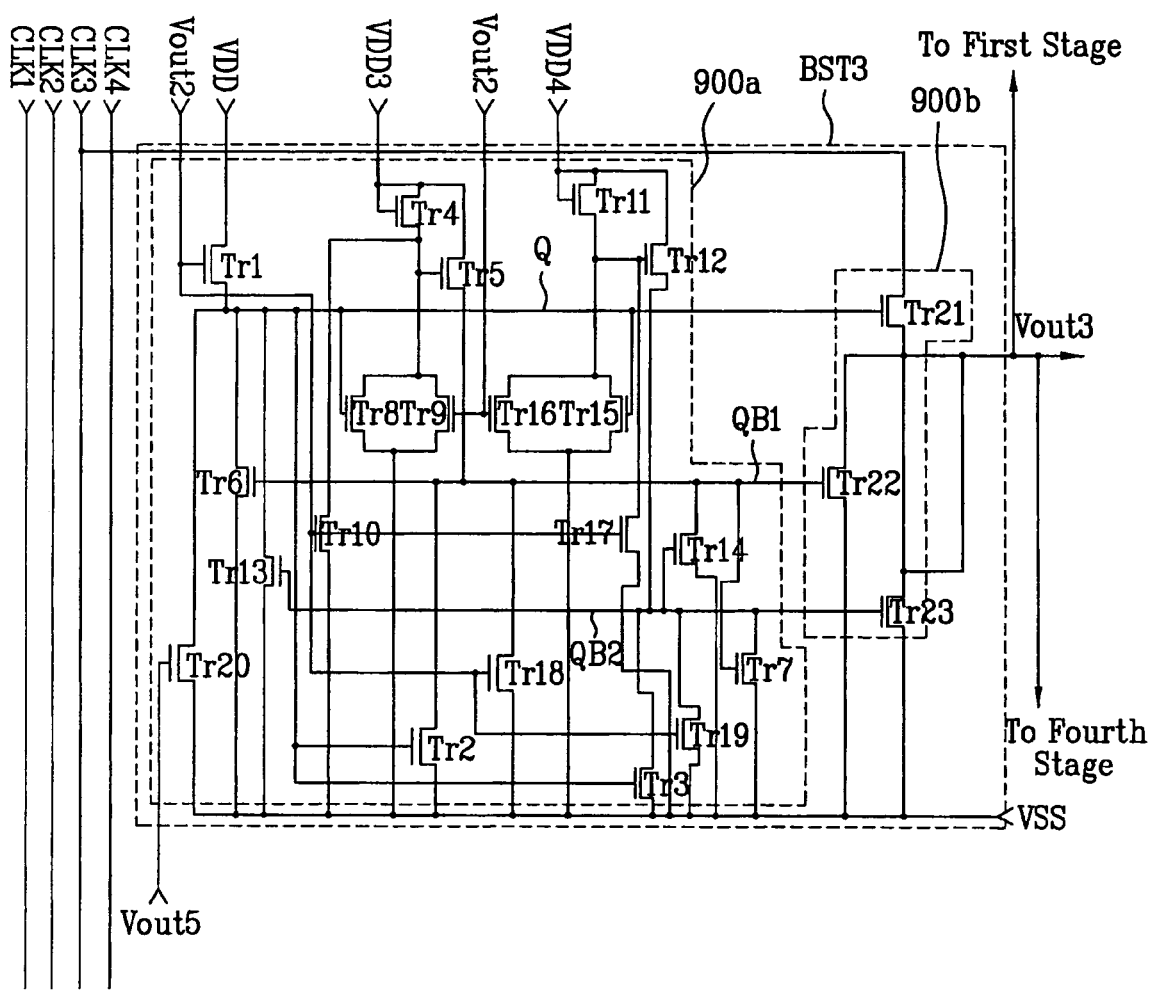
FIG. 9 is a circuit diagram illustrating a circuit configuration included in the third stage of the first shift register shown in FIG. 3.

FIG. 9 is a circuit diagram illustrating a circuit configuration included in the third stage of the first shift register shown in FIG. 3. The node controller of the third stage BST3, which is designated by reference numeral 900a, includes first through twentieth transistors Tr1 to Tr20.

The first NMOS transistor Tr1 charges the first node Q with the first voltage VDD in response to a scan pulse from the stage arranged first upstream from the third stage BST3. That is, the first NMOS transistor Tr1 charges the first node Q with the first voltage VDD in response to the second scan pulse Vout2 from the second stage BST2. For this operation, the a gate terminal of the first NMOS transistor is connected to the second stage BST2; the source terminal is connected to a power line for transferring the first voltage VDD; and the drain terminal is connected to the first node Q.

The second NMOS transistor Tr2 discharges the second node QB1 with the second voltage VSS in response to the first voltage VDD charged in the first node Q. For this operation, the the gate terminal of second NMOS transistor is connected to the first node Q; the source terminal is connected to the second node QB1; and, the drain terminal is connected to a power line for transferring the second voltage VSS.

The third NMOS transistor Tr3 discharges the third node QB2 with the second voltage VSS in response to the first voltage VDD charged in the first node Q. For this operation, the gate terminal of the third NMOS transistor Tr3 is connected to the first node Q; the source terminal is connected, to the third node QB2; and, the drain terminal is connected, to the power line for transferring the second voltage VSS.

The fourth NMOS transistor Tr4 is turned on or off in response to the third voltage VDD3, each of which is alternately varied in polarity on a frame basis. In an ON state thereof, the fourth NMOS transistor Tr4 outputs the third voltage VDD3. For this operation, the gate and source terminals of the fourth NMOS transistor Tr4 are connected, to a power line for transferring the third voltage VDD3.

The fifth NMOS transistor Tr5 charges the second node QB1 with the third voltage VDD3 output from the fourth NMOS transistor Tr4 in response to the third voltage VDD3. For this operation, the gate terminal of the fifth NMOS transistor Tr5 is connected to the drain terminal of the fourth NMOS transistor Tr4; the source terminal is connected to the power line for transferring the third voltage VDD3; and, the drain terminal is connected to the second node QB1.

The sixth NMOS transistor Tr6 discharges the first node Q with the second voltage VSS in response to the third voltage VDD3 charged in the second node QB1. For this operation, the gate terminal of the sixth NMOS transistor Tr6 is connected to the second node QB1; the source terminal is connected to the first node Q; and, the drain terminal is connected to the power line for transferring the second voltage VSS.

The seventh NMOS transistor Tr7 discharges the third node QB2 with the second voltage VSS in response to the third voltage VDD3 charged in the second node QB1. For this operation, the gate terminal of the seventh NMOS transistor Tr7 is connected to the second node QB1; the source terminal is connected to the third node QB2; and the drain terminal is connected to the power line for transferring the second voltage VSS.

The eighth NMOS transistor Tr8 supplies the second voltage VSS to the gate terminal of the fifth NMOS transistor Tr5 in response to the first voltage VDD charged in the first node Q, to turn off the fifth NMOS transistor Tr5. For this operation, the gate terminal of the eighth NMOS transistor Tr8 is connected to the first node Q; the source terminal is connected to the gate terminal of the fifth NMOS transistor Tr5; and the drain terminal is connected to the power line for transferring the second voltage VSS.

The ninth NMOS transistor Tr9 supplies the second voltage VSS to the gate terminal of the fifth NMOS transistor Tr5 in response to the scan pulse from the first upstream stage, to turn off the fifth NMOS transistor Tr5. That is, the ninth NMOS transistor Tr9 supplies the second voltage VSS to the gate terminal of the fifth NMOS transistor Tr5 in response to the scan pulse Vout2 from the second stage BST2, to turn off the fifth NMOS transistor Tr5. For this operation, the gate terminal of the ninth NMOS transistor Tr9 is connected to the second stage BST2; the source terminal is connected to the gate terminal of the fifth NMOS transistor Tr5; and the drain terminal is connected to the power line for transferring the second voltage VSS.

The tenth NMOS transistor Tr10 supplies the second voltage VSS to the gate terminal of the fifth NMOS transistor Tr5 in response to the scan pulse from the first upstream stage, to turn off the fifth NMOS transistor Tr5. That is, the tenth NMOS transistor Tr10 supplies the second voltage VSS to the gate terminal of the fifth NMOS transistor Tr5 in response to the scan pulse Vout2 from the second stage BST2, to turn off the fifth NMOS transistor Tr5. For this operation, the gate terminal of the tenth NMOS transistor Tr10 is connected to the second stage BST2; the source terminal is connected to the gate terminal of the fifth NMOS transistor Tr5; and the drain terminal is connected to the power line for transferring the second voltage VSS.

The eleventh NMOS transistor Tr11 is turned on or off in response to the fourth voltage VDD4 which is alternately varied in polarity on a frame basis. In an ON state thereof, the eleventh NMOS transistor Tr11 outputs the fourth voltage VDD4. For this operation, the gate and source terminals of the eleventh NMOS transistor Tr11 are connected to a power line for transferring the fourth voltage VDD4. The fourth voltage VDD4 has a polarity opposite to that of the third voltage VDD3 in each frame.

The twelfth NMOS transistor Tr12 charges the third node QB2 with the fourth voltage VDD4 output from the eleventh NMOS transistor Tr11 in response to the fourth voltage VDD4. For this operation, the gate terminal of the twelfth NMOS transistor Tr12 is connected to a drain terminal of the eleventh NMOS transistor Tr11; the source terminal is connected, to the power line for transferring the fourth voltage VDD4; and the drain terminal is connected, to the third node QB2.

The thirteenth NMOS transistor Tr13 discharges the first node Q with the second voltage VSS in response to the fourth voltage VDD4 charged in the third node QB2. For this operation, the gate terminal of the thirteenth NMOS transistor Tr13 is connected to the third node QB2; the source terminal is connected to the first node Q; and the drain terminal is connected to the power line for transferring the second voltage VSS.

The fourteenth NMOS transistor Tr14 discharges the second node QB1 with the second voltage VSS in response to the fourth voltage VDD4 charged in the third node QB2. For this operation, the gate terminal of the fourteenth NMOS transistor Tr14 is connected to the third node QB2; the source terminal is connected, to the second node QB1; and the drain terminal is connected to the power line for transferring the second voltage VSS.

The fifteenth NMOS transistor Tr15 supplies the second voltage VSS to the gate terminal of the twelfth NMOS transistor Tr12 in response to the first voltage VDD charged in the first node Q, to turn off the twelfth NMOS transistor Tr12. For this operation, the gate terminal of the fifteenth NMOS transistor Tr15 is connected, at a gate terminal thereof, to the first node Q; the source terminal is connected to the gate terminal of the twelfth NMOS transistor Tr12; and the drain terminal is connected to the power line for transferring the second voltage VSS.

The sixteenth NMOS transistor Tr16 supplies the second voltage VSS to the gate terminal of the twelfth NMOS transistor Tr12 in response to the scan pulse from the first upstream stage, to turn off the twelfth NMOS transistor Tr12. That is, the sixteenth NMOS transistor Tr16 turns off the twelfth NMOS transistor Tr12 in response to the second scan pulse Vout2 from the second stage BST2. For this operation, the gate terminal of the sixteenth NMOS transistor Tr16 is connected to the second stage BST2; the source terminal is connected to the gate terminal of the twelfth NMOS transistor Tr12; and the drain terminal and is connected to the power line for transferring the second voltage VSS.

The seventeenth NMOS transistor Tr17 supplies the second voltage VSS to the gate terminal of the twelfth NMOS transistor Tr12 in response to the scan pulse from the first upstream stage, to turn off the twelfth NMOS transistor Tr12. That is, the seventeenth NMOS transistor Tr17 turns off the twelfth NMOS transistor Tr12 in response to the second scan pulse Vout2 from the second stage BST2. For this operation, the gate terminal of the seventeenth NMOS transistor Tr17 is connected to the second stage BST2; the source terminal is connected to the gate terminal of the twelfth NMOS transistor Tr12; and, the drain terminal is connected, to the power line for transferring the second voltage VSS.

The eighteenth NMOS transistor Tr18 discharges the second node QB1 with the second voltage VSS in response to the scan pulse from the first upstream stage. That is, the eighteenth NMOS transistor Tr18 discharges the second node QB1 with the second voltage VSS in response to the scan pulse Vout2 from the second stage BST2. For this operation, the gate terminal of the eighteenth NMOS transistor Tr18 is connected to the second stage BST2; the source terminal is connected to the second node QB1; and the drain terminal is connected to the power line for transferring the second voltage VSS.

The nineteenth NMOS transistor Tr19 discharges the third node QB2 with the second voltage VSS in response to the scan pulse from the first upstream stage. That is, the nineteenth NMOS transistor Tr19 discharges the third node QB2 with the second voltage VSS in response to the scan pulse Vout2 from the second stage BST2. For this operation, the gate terminal of the nineteenth NMOS transistor Tr19 is connected to the second stage BST2; the source terminal is connected to the third node QB2; and, the drain terminal is connected to the power line for transferring the second voltage VSS.

The twentieth NMOS transistor Tr20 discharges the first node Q with the second voltage VSS in response to a scan pulse from the stage arranged second downstream from the third stage BST3. That is, the twentieth NMOS transistor Tr20 discharges the first node Q with the second voltage VSS in response to the fifth scan pulse Vout5 from the fifth stage BST5. For this operation, the gate terminal of the twentieth NMOS transistor Tr20 is connected to the output unit of the fifth stage BST5; the source terminal is connected to the first node Q; and, the drain terminal is connected to the power line for transferring the second voltage VSS.

The output unit of the third stage BST3, which is designated by reference numeral 900b, includes twenty-first through twenty-third NMOS transistors Tr21 to Tr23.

The twenty-first NMOS transistor Tr21 outputs the third clock pulse CLK3 to the associated gate line as a scan pulse, in response to the first voltage VDD charged in the first node Q. The third scan pulse Vout3 is also supplied to both the second upstream stage and the first downstream stage. For this operation, the gate terminal of the twenty-first NMOS transistor Tr21 is connected to the first node Q; the source terminal is connected to the clock line for transferring the third clock pulse CLK3; and the drain terminal is connected to the third gate line, the gate terminal of the twentieth NMOS transistor Tr20 in the first stage BST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage BST4.

The twenty-second NMOS transistor Tr22 outputs the second voltage VSS to the associated gate line in response to the third voltage VDD3 charged in the second node QB1. That is, the twenty-second NMOS transistor Tr22 supplies the second voltage VSS to the third gate line in response to the third voltage VDD3 charged in the second node QB1. For this operation, the gate terminal of the twenty-second NMOS transistor Tr22 is connected to the second node QB1; the drain terminal is connected to the power line for transferring the second voltage VSS; and the source terminal is connected to the third gate line, the gate terminal of the twentieth NMOS transistor Tr20 in the first stage BST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage BST4.

The twenty-third NMOS transistor Tr23 outputs the second voltage VSS to the associated gate line in response to the fourth voltage VDD4 charged in the third node QB2. That is, the twenty-third NMOS transistor Tr23 supplies the second voltage VSS to the third gate line in response to the fourth voltage VDD4 charged in the third node QB2. For this operation, the gate terminal of the twenty-third NMOS transistor Tr23 is connected to the second node QB1; the drain terminal is connected to the power line for transferring the second voltage VSS; and the source terminal is connected to the third gate line, the gate terminal of the twentieth NMOS transistor Tr20 in the first stage BST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage BST4.

The first and second stages BST1 and BST2, fourth through n-th stages BST4 to BSTn, and first and second dummy stages BSTn+1 and BSTn+2 have the same configuration as the third stage BST3.

Since there is no stage upstream from the first stage BST1, the first, ninth, tenth, sixteenth, seventeenth, eighteenth, and nineteenth NMOS transistors Tr1, Tr9, Tr10, Tr16, Tr17, Tr18, and Tr19 in the first stage BST4 receive a start pulse SP from the timing controller. That is, the first NMOS transistor Tr1 of the first stage BST1 charges the first node Q of the first stage BST1 with the first voltage VDD in response to the start pulse SP from the timing controller.

The ninth NMOS transistor Tr9 of the first stage BST1 discharges the second node QB1 of the first stage BST1 with the second voltage VSS in response to the start pulse SP from the timing controller.

The tenth NMOS transistor Tr10 of the first stage BST1 supplies the second voltage VSS to the gate terminal of the fourth NMOS transistor Tr4 in response to the start pulse SP from the timing controller, to turn off the fourth NMOS transistor Tr4.

The sixteenth NMOS transistor Tr16 of the first stage BST1 supplies the second voltage VSS to the gate terminal of the twentieth NMOS transistor Tr12 in response to the start pulse SP from the timing controller, to turn off the twentieth NMOS transistor Tr12.

The seventeenth NMOS transistor Tr17 of the first stage BST1 supplies the second voltage VSS to the gate terminal of the twentieth NMOS transistor Tr12 in response to the start pulse SP from the timing controller, to turn off the twentieth NMOS transistor Tr12.

The eighteenth NMOS transistor Tr18 of the first stage BST1 discharges the second node QB1 with the second voltage VSS in response to the start pulse SP from the timing controller.

The nineteenth NMOS transistor Tr19 of the first stage BST1 discharges the third node QB2 with the second voltage VSS in response to the start pulse SP from the timing controller.

There is no stage arranged second upstream from the first stage BST1 or second stage BST2. For this reason, the first stage BST1 supplies the first scan pulse Vout1 output therefrom to the first gate line and second stage BST2. Similarly, the second stage BST2 supplies the second scan pulse Vout2 output therefrom to the second gate line and third stage BST3.

There is no stage arranged first downstream from the second dummy stage BSTn+2. Accordingly, the source terminal of the twenty-first NMOS transistor Tr21, the drain terminal of the twenty-second NMOS transistor Tr22, and the drain terminal of the twenty-third NMOS transistor Tr23 in the second dummy stage BSTn+2 are connected to the gate terminal of the twentieth NMOS transistor Tr20 of the n-th stage BSTn.

The stages BST1 to BSTn+2 of the second shift register 301b have the same configuration as the stages BST1 to BSTn+2 of the first shift register 301a.

Figure 10A:
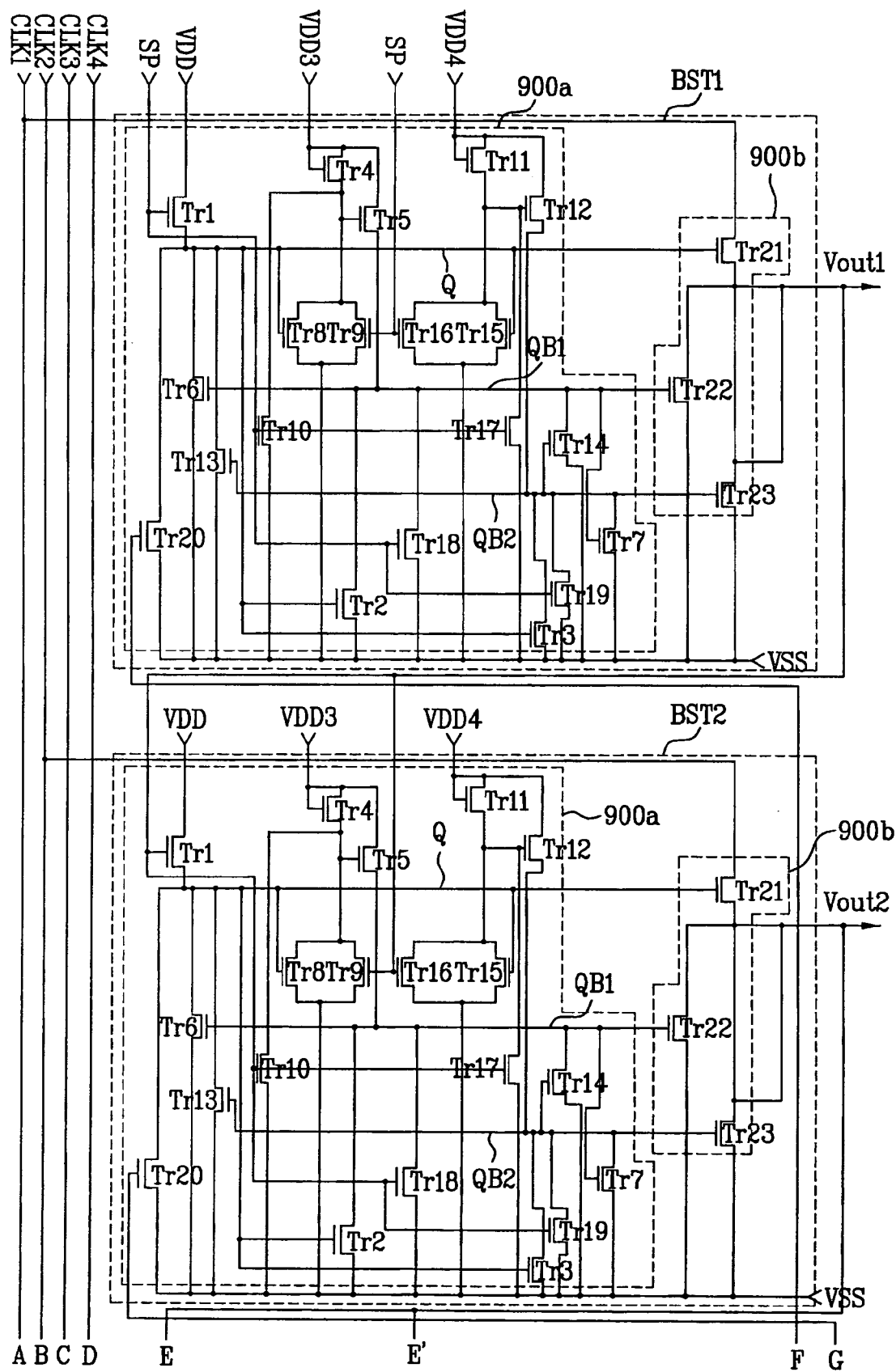
FIGS. 10A and 10B are circuit diagrams illustrating the first through third stages of the first shift register, each of which has a circuit configuration shown in FIG. 9.
Figure 10B:
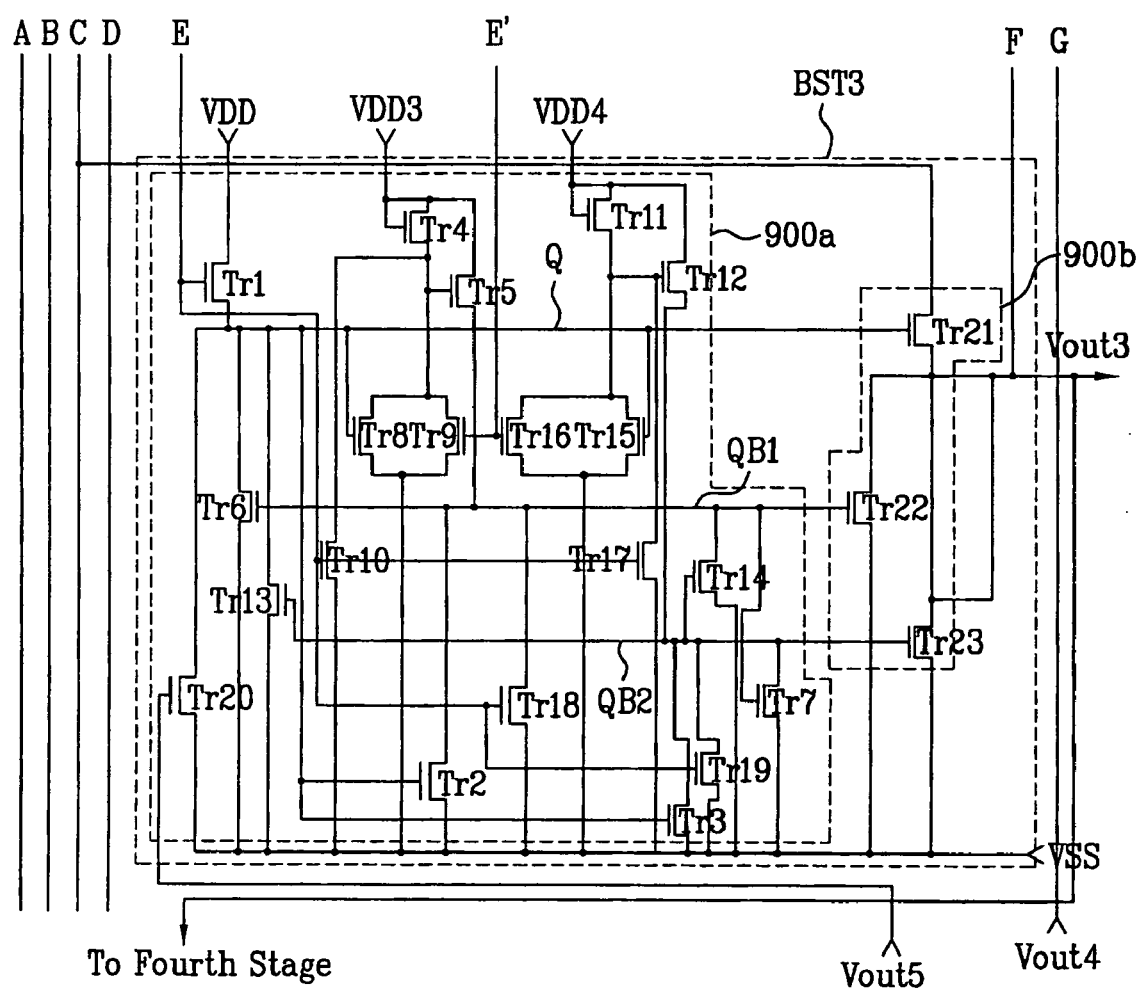

FIGS. 10A and 10B are circuit diagrams illustrating the first through third stages of the first shift register, each of which has a circuit configuration shown in FIG. 9.

In the following description, it is assumed that, in a first frame, the third voltage VDD3 is maintained in a positive polarity state, and the fourth voltage VDD4 is maintained in a negative polarity state. It is also assumed that, in a second frame, the third voltage VDD3 is maintained in a negative polarity state, and the fourth voltage VDD4 is maintained in a positive polarity state. That is, it is assumed that, in odd-numbered frames, the third voltage VDD3 is maintained in a positive polarity state, and the fourth voltage VDD4 is maintained in a negative polarity state, whereas, in even-numbered frames, the third voltage VDD3 is maintained in a negative polarity state, and the fourth voltage VDD4 is maintained in a positive polarity state.

A start pulse SP is applied to the gate terminals of the first, ninth, tenth, sixteenth, seventeenth, eighteenth, and nineteenth NMOS transistors Tr1, Tr9, Tr10, Tr16, Tr17, Tr18, and Tr19. As a result, the first, ninth, tenth, sixteenth, seventeenth, eighteenth, and nineteenth NMOS transistors Tr1, Tr9, Tr10, Tr16, Tr17, Tr18, and Tr19 are turned on.

The first voltage VDD is then supplied to the first node Q via the turned-on first NMOS transistor Tr1. As the first node Q is charged with the first voltage VDD, the second, third, eighth, fifteenth, and twenty-first NMOS transistors Tr2, Tr3, Tr8, Tr15, and Tr21, each of which is connected, at the gate terminal thereof, to the first node Q, are turned on.

The second voltage VSS is supplied to the second node QB1 via the turned-on second and eighth NMOS transistors Tr2 and Tr8. Thus, the second node QB1 is discharged. As a result, the sixth, seventh, and twenty-second NMOS transistors Tr6, Tr6, and Tr22, each of which is connected, at the gate terminal thereof, to the second node QB1, are turned off.

The second voltage VSS is also supplied to the third node QB2 via the turned-on third and nineteenth NMOS transistors Tr3 and Tr19. Accordingly, the third node QB2 is discharged. As a result, the thirteenth, fourteenth, and twenty-third transistors Tr13, Tr14, and Tr23, each of which is connected, at the gate terminal thereof, to the third node QB2, are turned off.

The second voltage VSS is also supplied to the gate terminal of the fifth NMOS transistor Tr5 via the turned-on eighth, ninth, and tenth NMOS transistors Tr8, Tr9, and Tr10. The third voltage VDD3 is supplied to the gate terminal of the fifth NMOS transistor Tr5 via the fourth NMOS transistor Tr4 which is maintained in an ON state by the third voltage VDD3 during the first frame in which the third voltage VDD3 has a positive polarity. Thus, both the second voltage VSS and the third voltage VDD3 are supplied to the gate terminal of the fifth NMOS transistor Tr5. However, the gate terminal of the fifth NMOS transistor Tr5 is maintained at the second voltage VSS because the number of transistors supplying the second voltage VSS to the gate terminal of the fifth NMOS transistor Tr5 is larger than the number of transistors supplying the third voltage VDD3 to the gate terminal of the fifth NMOS transistor Tr5. As a result, the fifth NMOS transistors Tr5 is turned off.

The second voltage VSS is applied to the gate terminal of the twelfth NMOS transistor Tr12 via the turned-on fifteenth, sixteenth, and seventeenth NMOS transistors Tr15, Tr16, and Tr17. Accordingly, the twelfth NMOS transistor Tr12 is turned off. Meanwhile, the eleventh NMOS transistor Tr11 is maintained in an OFF state during the first frame by the fourth voltage VDD4 which is maintained in a negative polarity state in the first frame.

Thus, the first node Q of the first stage BST1 is charged with the first voltage VDD, and the second and third nodes QB1 and QB2 are discharged with the second voltage VSS, as describe above. Accordingly, the first stage BST1 is enabled.

When a first clock pulse CLK1 is supplied to the twenty-first NMOS transistor Tr21 of the first stage BST1 in the above-described state, the twenty-first NMOS transistor Tr21 outputs the first clock pulse CLK1 as the first scan pulse Vout1. In this case, the first scan pulse Vout1 is output while being overlapped with the start pulse SP because the first clock pulse CLK1 is overlapped with the start pulse SP.

The first scan pulse Vout1 is supplied to the first gate line and second stage BST2. That is, the first scan pulse Vout1 from the first stage BST1 is supplied to the first, ninth, tenth, sixteenth, seventeenth, eighteenth, and nineteenth NMOS transistors Tr1, Tr9, Tr10, Tr16, Tr17, Tr18, and Tr19 of the second stage BST2. As a result, the first node Q of the second stage BST2 is charged, whereas the second and third nodes QB1 and QB2 of the second stage BST2 are discharged. That is, the second stage BST2 is enabled by the first scan pulse Vout1. In other words, the second stage BST2 is enabled by the first scan pulse Vout1, similarly to the first stage BST1 which is enabled by the start pulse SP. When a second clock pulse CLK2 is supplied to the twenty-first NMOS transistor Tr21 of the second stage BST2 in the above-described state, the twenty-first NMOS transistor Tr21 outputs the second clock pulse CLK2 as the second scan pulse Vout2. In this case, the second scan pulse Vout2 is output while being overlapped with the first scan pulse Vout1 because the second clock pulse CLK2 is overlapped with the first clock pulse CLK1.

The second scan pulse Vout2 is supplied to the second gate line and third stage BST3. That is, the second scan pulse Vout2 from the second stage BST2 is supplied to the first, ninth, tenth, sixteenth, seventeenth, eighteenth, and nineteenth NMOS transistors Tr1, Tr9, Tr10, Tr16, Tr17, Tr18, and Tr19 of the third stage BST3. As a result, the first node Q of the third stage BST3 is charged, whereas the second and third nodes QB1 and QB2 of the third stage BST3 are discharged. That is, the third stage BST3 is enabled by the second scan pulse Vout2. In other words, the third stage BST3 is enabled by the second scan pulse Vout2, similarly to the first stage BST1 which is enabled by the start pulse SP.

When a third clock pulse CLK3 is supplied to the twenty-first NMOS transistor Tr21 of the third stage BST3 in the above-described state, the twenty-first NMOS transistor Tr21 outputs the third clock pulse CLK3 as the third scan pulse Vout3. In this case, the third scan pulse Vout3 is output while being overlapped with the second scan pulse Vout2 because the third clock pulse CLK3 is overlapped with the second clock pulse CLK2.

The third scan pulse Vout3 is supplied to the third gate line and fourth stage BST4. That is, the third scan pulse Vout3 from the third stage BST3 is supplied to the first, ninth, tenth, sixteenth, seventeenth, eighteenth, and nineteenth NMOS transistors Tr1, Tr9, Tr10, Tr16, Tr17, Tr18, and Tr19 of the fourth stage BST4. As a result, the first node Q of the fourth stage BST4 is charged, whereas the second and third nodes QB1 and QB2 of the fourth stage BST4 are discharged. That is, the fourth stage BST4 is enabled by the third scan pulse Vout3. In other words, the fourth stage BST4 is enabled by the third scan pulse Vout3, similarly to the first stage BST1 which is enabled by the start pulse SP.

When a fourth clock pulse CLK4 is supplied to the twenty-first NMOS transistor Tr21 of the fourth stage BST4 in the above-described state, the twenty-first NMOS transistor Tr21 outputs the fourth clock pulse CLK4 as the fourth scan pulse Vout4. In this case, the fourth scan pulse Vout4 is output while being overlapped with the third scan pulse Vout3 because the fourth clock pulse CLK4 is overlapped with the third clock pulse CLK3.

The third scan pulse Vout3 output from the third stage BST3 is also supplied to the twentieth NMOS transistor Tr20 of the first stage BST1. That is, the third scan pulse Vout3 is supplied to the gate terminal of the twentieth NMOS transistor Tr12 in the first stage BST1. As a result, the first stage BST1 is disabled.

In detail, the third scan pulse Vout3 turns on the twentieth NMOS transistor Tr20 of the first stage BST1. Accordingly, the second voltage VSS is supplied to the first node Q of the first stage BST1 via the turned-on twentieth NMOS transistor Tr20. Thus, the first node Q of the first stage BST1 is discharged. As a result, the second, eighth, fifteenth, and twenty-first NMOS transistors Tr2, Tr8, Tr15, and Tr21 connected to the first node Q of the first stage BST1 are turned off. Also, as the start pulse SP is transited to a low-level state, the first, ninth, tenth, sixteenth, seventeenth, eighteenth, and nineteenth NMOS transistors Tr1, Tr9, Tr10, Tr16, Tr17, Tr18, and Tr19 of the first stage BST1, which receive the low-level start pulse SP, are turned off.

As the ninth and tenth NMOS transistors Tr9 and Tr10 of the first stage BST1 are turned off, the second voltage VSS can no longer be supplied to the gate terminal of the fifth NMOS transistor Tr5. In place of the second voltage VSS, the third voltage VDD3 is supplied to the gate terminal of the fifth NMOS transistor Tr5 in the first stage BST1 via the fourth NMOS transistor Tr4. As a result, the fifth NMOS transistor Tr5 is turned on by the third voltage VDD3. The third voltage VDD3 is then supplied to the second node QB1 of the first stage BST1 via the turned-on fifth NMOS transistor Tr5. Accordingly, the second node QB1 of the first stage BST1 is charged. Also, the sixth, seventh, and twenty-second NMOS transistors Tr6, Tr7, and Tr22, each of which is connected, at the gate terminal thereof, to the second node QB1 of the first stage BST1, are turned on.

The second voltage VSS is also supplied to the first node Q of the first stage BST1 via the turned-on sixth NMOS transistor Tr6. As a result, the discharge rate of the first node Q in the first stage BST1 is increased. The second voltage VSS is also supplied to the third node QB2 of the first stage BST1 via the turned-on seventh NMOS transistor Tr7. Accordingly, the third node QB2 is discharged. As a result, the thirteenth, fourteenth, and twenty-third NMOS transistors Tr13, Tr14, and Tr23, each of which is connected, at the gate terminal thereof, to the third node QB2, are turned off.

Thus, by the third scan pulse Vout3 from the third stage BST3, the first and third nodes Q and QB2 of the first stage BST1 are discharged, whereas the second node QB1 of the first stage BST1 is charged. That is, the first stage BST1 is disabled in response to the third scan pulse Vout3 from the third stage BST3. The disabled first stage BST1 outputs the second voltage VSS via the twenty-second NMOS transistor Tr22 included in the first stage BST1, to supply the second voltage VSS to the first gate line.

In the above-described manner, each of the stages BST1 to BSTn+2 is enabled by the scan pulse output from the first upstream stage, and is disabled by the scan pulse output from the second downstream stage.

Meanwhile, in the second frame, the third voltage VDD3 is maintained in a negative polarity state, whereas the fourth voltage VDD4 is in a positive polarity state. Accordingly, when each of the stages BST1 to BSTn+2 is disabled, the second node QB1 of the stage is discharged, whereas the third node QB2 of the stage is charged. That is, when each of the stages BST1 to BSTn+2 is disabled, the second voltage VSS is output via the twenty-third NMOS transistor Tr23 connected, at the gate terminal thereof, to the third node QB2. Thus, the second and third nodes QB1 and QB2 are alternately charged and discharged on a frame-by-frame basis, thereby preventing the twenty-second and twenty-third transistors Tr22 and Tr23 included in the output unit 900b from being degraded.

The stages BST1 to BSTn+2 of the second shift register 301b operate in the same manner as the stages BST1 to BSTn+2 of the first shift register 301a, respectively. However, each of the stages BST1 to BSTn+2 in the first shift register 301a applies an associated one of scan pulses Vout1 to Voutn to one end of an associated one of the gate lines GL1 to GLn, whereas each of the stages BST1 to BSTn+2 in the second shift register 301b applies an associated one of scan pulses Vout1 to Voutn to the other end of an associated one of the gate lines GL1 to GLn.

Figure 11:
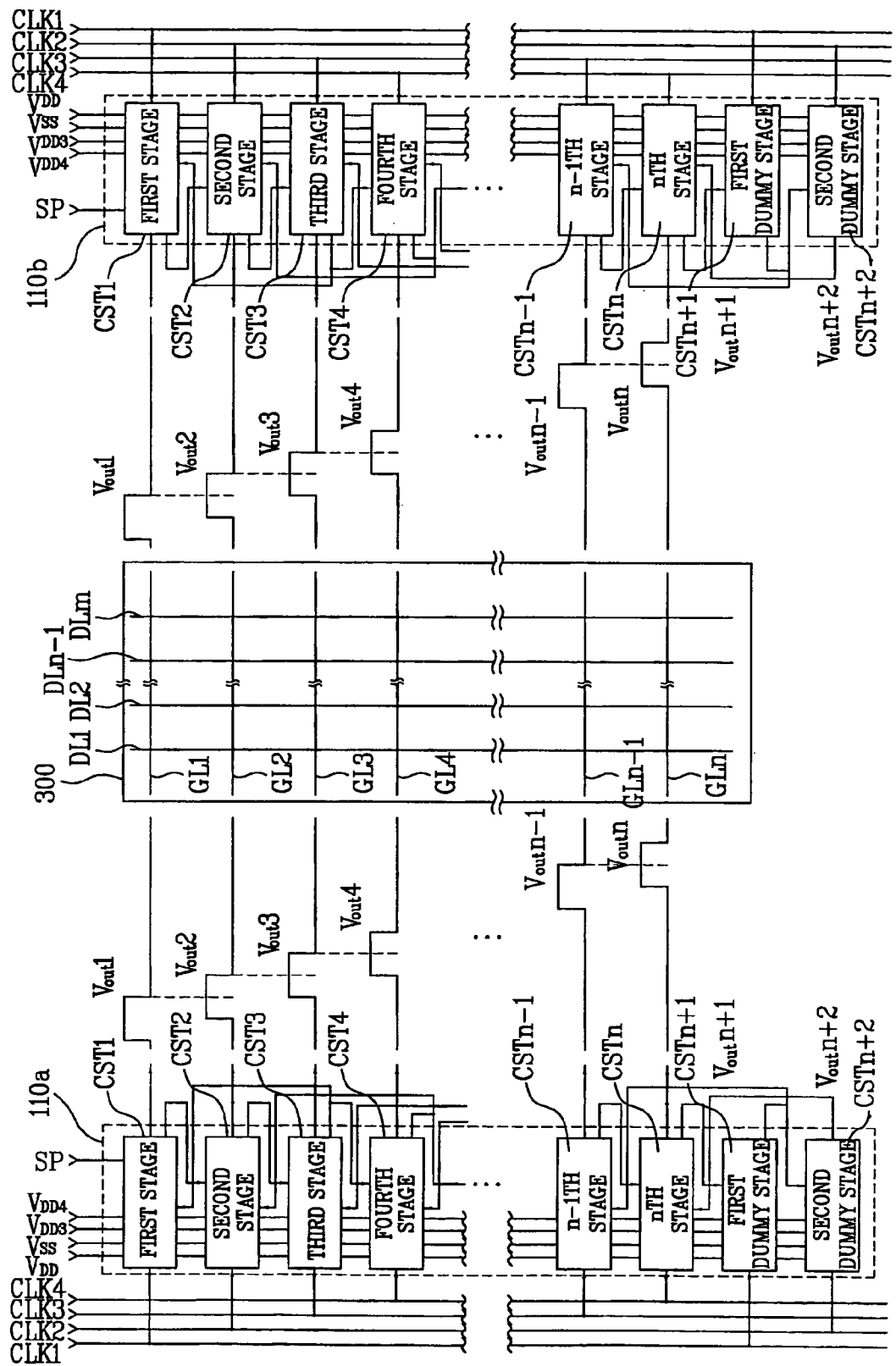
FIG. 11 is a block diagram illustrating a shift register according to a second embodiment.

FIG. 11 is a block diagram illustrating a shift register according to a second embodiment.

The shift register includes a first shift register 110a and a second shift register 110b.

The first shift register 110a includes n stages CST1 to CSTn, a first dummy stage CSTn+1, and a second dummy stage CSTn+2 which are connected in series. The stages CST1 to CSTn+2 output pairs of scan pulses Vout1 to Voutn+2, respectively. That is, each of the stages CST1 to CSTn+2 simultaneously outputs a pair of scan pulses. Also, the scan pulses Vout1 to Voutn+2 are output in a sequential manner from the stages CST1 to CSTn+2. The scan pulses Vout1 to Voutn output from the stages CST1 to CSTn, except for the first and second dummy stages CSTn+1 and CSTn+2, are sequentially supplied to the gate lines GL1 to GLn of the LCD panel 300, respectively, to cause the gate lines GL1 to GLn to be sequentially scanned.

The first stage CST1 simultaneously outputs a pair of first scan pulses Vout1. Subsequently, the second stage CST2 simultaneously outputs a pair of second scan pulses Vout2. Next, the third stage CST3 simultaneously outputs a pair of third scan pulses Vout3. In such a manner, finally, the n-th stage CSTn simultaneously outputs a pair of n-th scan pulses Voutn. After the n-th stage CSTn simultaneously outputs a pair of n-th scan pulses Voutn, the first dummy stage CSTn+1 simultaneously outputs a pair of n+1-th scan pulses Voutn+1. The n+1-th scan pulses Voutn+1 are not supplied to any gate line, but are supplied to the n−1-th stage CSTn−1. After the first dummy stage CSTn+1 simultaneously outputs a pair of n+1-th scan pulses Voutn+1, the second dummy stage CSTn+2 simultaneously outputs a pair of n+2-th scan pulses Voutn+2. The n+2-th scan pulses Voutn+2 are not supplied to any gate line, but are supplied to the n-th stage CSTn. Meanwhile, the scan pulses Vout1 to Voutn+2 output from respective stages CST1 to CSTn+2 have a pulse width such that successive ones of the scan pulses Vout1 to Voutn+2 are overlapped with each other for a predetermined width.

Each of the stages CST1 to CSTn+2 has two output terminals (the first and second output terminals), to simultaneously output scan pulses through the first and second output terminals, respectively. In other words, each of the stages CST1 to CSTn+2 outputs one scan pulse through the first output terminal thereof, and simultaneously outputs the other scan pulse through the second output terminal thereof. Thus, two scan pulses are simultaneously output from each of the stages CST1 to CSTn+2. In this case, the scan pulses Vout1 to Voutn+2 output from respective first output terminals of the stages CST1 to CSTn+2 have a pulse width such that successive ones of the scan pulses Vout1 to Voutn+2 are overlapped with each other for a predetermined width. Also, the scan pulses Vout1 to Voutn+2 output from respective second output terminals of the stages CST1 to CSTn+2 have a pulse width such that successive ones of the scan pulses Vout1 to Voutn+2 are overlapped with each other for the predetermined width. For example, the two first scan pulses Vout1 output from the first stage CST1 are overlapped with the two second scan pulses Vout2 output from the second stage CST2 are overlapped with each other by the predetermined width.

Each of the stages CST1 to CSTn+2 included in the first shift register 110a supplies one of the two scan pulses thereof to an associated gate line, and supplies the other scan pulse to both the first downstream stage and the second upstream stage. For example, the third stage CST3, which outputs two third scan pulses Vout3, supplies one third scan pulse Vout3 to the third gate line, and supplies the other third scan pulses Vout3 to the fourth stage CST4 and first stage CST1. Meanwhile, the second dummy stage CSTn+2 may output two scan pulses, or may output a single scan pulse.

Each of the stages CST1 to CSTn+2 of the first shift register 110a receives first through fourth voltages VDD, VSS, VDD3, and VDD4, and one of first through fourth clock pulses CLK1 to CLK4 which are repeated while having a time (phase) difference between successive clock pulses. The first voltage VDD may be a DC voltage having a positive polarity, whereas the second voltage VSS may be a voltage having a negative polarity. Each of the third and fourth voltages VDD3 and VDD4 is an AC voltage which is alternately varied in polarity on a frame-by-frame basis. The third and fourth voltages VDD3 and VDD4 have differing polarities in the same frame.

The first through fourth clock pulses CLK1 to CLK4 are output after being time (phase)-delayed from one another by one pulse width. That is, the second clock pulse CLK2 is output after being phase-delayed from the first clock pulse CLK1 by one pulse width. The third clock pulse CLK3 is output after being phase-delayed from the second clock pulse CLK2 by one pulse width. The fourth clock pulse CLK4 is output after being phase-delayed from the third clock pulse CLK3 by one pulse width. The first through fourth clock pulses CLK1 to CLK4 are sequentially output in a circulating manner. That is, one set of first through fourth clock pulses CLK1 to CLK4 are sequentially output, and then another set of first through fourth clock pulses CLK1 to CLK4 are sequentially output. Accordingly, the first clock pulse CLK1 is output in a period between the point of time when the fourth clock pulse CLK4 is output and the point of time when the second clock pulse CLK2 is output. The fourth clock pulse CLK4 may be output in synchronism with the start pulse SP. In this case, the fourth clock pulse CLK4 is output earlier than the first through third clock pulses CLK1 to CLK3.

The first shift register 110a may use two or more clock pulses. That is, the first shift register 110a may use only two of the first through fourth clock pulses CLK1 to CLK4, for example, the first and second clock pulses CLK1 and CLK2, or may use only three of the first through fourth clock pulses CLK1 to CLK4, for example, the first through third clock pulses CLK1 to CLK3. Alternatively, the first shift register 110a may use at least five clock pulses which are sequentially output.

The second shift register 110b has the same configuration as the first shift register 110a.

Figure 12:
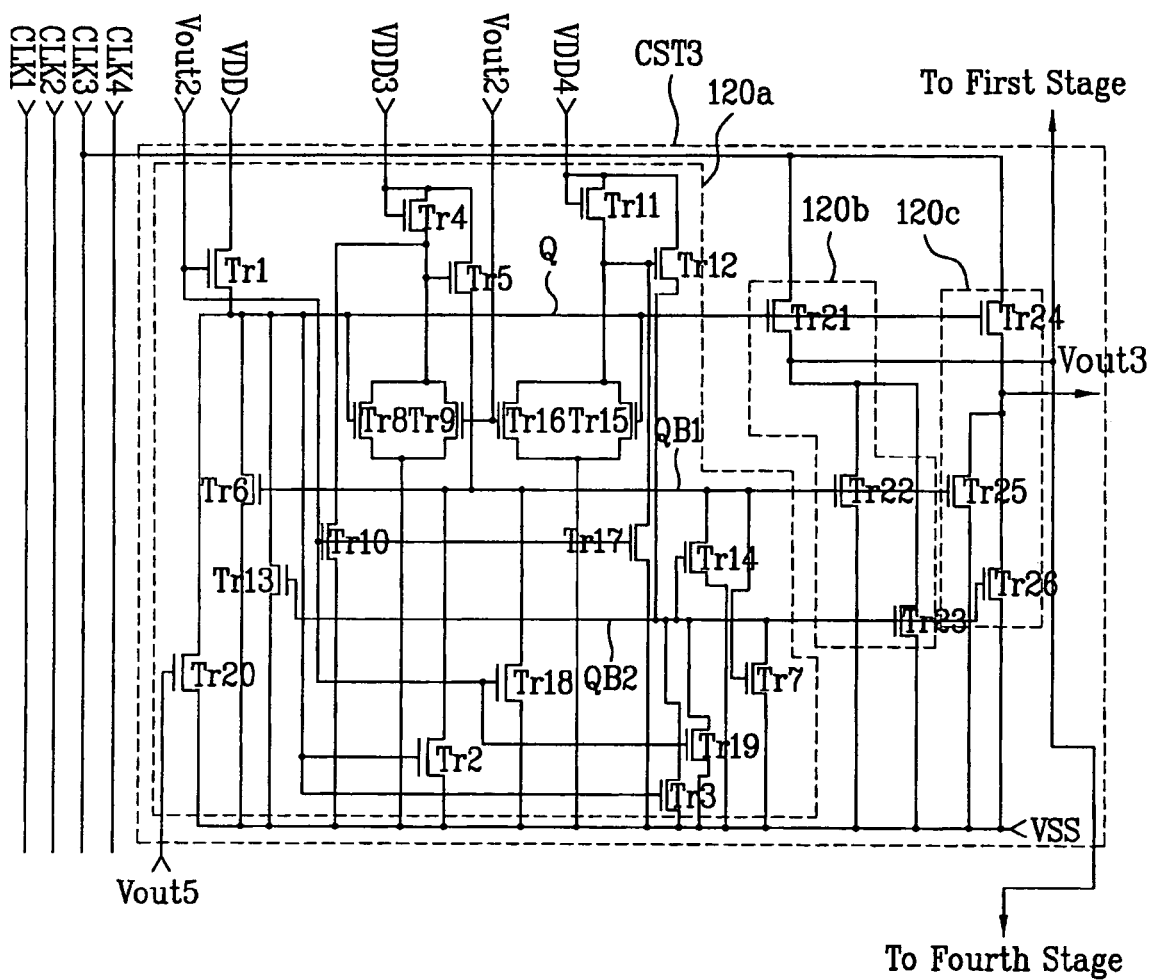
FIG. 12 is a circuit diagram illustrating a circuit included in the third stage of the first shift register shown in FIG. 11.

FIG. 12 is a circuit diagram illustrating a circuit included in the third stage of the first shift register shown in FIG. 11.

The third stage CST3 includes a node controller 120a which controls charging and discharging operations for first, second, and third nodes Q, QB1, and QB2, and output units 120b and 120c, each of which is turned on in accordance with charging/discharging states of the first, second, and third nodes Q, QB1, and QB2, to selectively output a scan pulse or the second voltage VSS. The first, second, and third nodes Q, QB1, and QB2 are selectively charged or discharged. In detail, when the first node Q is in a charging state, both the second and third nodes QB1 and QB2 are maintained in a discharging state. On the other hand, when the first node Q is in a discharging state, one of the second and third nodes QB1 and QB2 is maintained in a charging state. That is, when the first node Q is in a discharging state in an odd-numbered frame, the second node QB1 is charged, whereas the third node QB2 is discharged. On the other hand, when the first node Q is in a discharging state in an even-numbered frame, the second node QB1 is discharged, whereas the third node QB2 is charged. Voltages VDD3 and VDD4, have opposite polarities, are alternately varied in polarity on a frame-by-frame basis, and are applied to the second and third nodes QB1 and QB2 (charging and discharging), respectively, when the first node Q is in a discharging state, to prevent a degradation of switching elements connected, at gate terminals thereof, to the second and third nodes QB1 and QB2.

The node controller 120a of the third stage CST3 includes first through twentieth NMOS transistors Tr1 to Tr20.

The first NMOS transistor Tr1 charges the first node Q with the first voltage VDD in response to a scan pulse from the stage arranged first upstream from the third stage CST3. That is, the first NMOS transistor Tr1 charges the first node Q with the first voltage VDD in response to the second scan pulse Vout2 from the second stage CST2. For this operation, the gate terminal of the first NMOS transistor Tr1 is connected to the second stage CST2; the source terminal is connected to a power line for transferring the first voltage VDD; and the drain terminal is connected to the first node Q.

The second NMOS transistor Tr2 discharges the second node QB1 with the second voltage VSS in response to the first voltage VDD charged in the first node Q. For this operation, the gate terminal of the second NMOS transistor Tr2 is connected to the first node Q; the source terminal is connected to the second node QB1; and, the drain terminal is connected to a power line for transferring the second voltage VSS.

The third NMOS transistor Tr3 discharges the third node QB2 with the second voltage VSS in response to the first voltage VDD charged in the first node Q. For this operation, the gate terminal of the third NMOS transistor Tr3 is connected to the first node; the source terminal is connected to the third node QB2; and, the drain terminal is connected to the power line for transferring the second voltage VSS.

The fourth NMOS transistor Tr4 is turned on or off in response to the third voltage VDD3 which is alternately varied in polarity on a frame basis. In an ON state thereof, the fourth NMOS transistor Tr4 charges the second node QB1 with the third voltage VDD3. For this operation, the gate and source terminals of the fourth NMOS transistor Tr4 are connected to a power line for transferring the third voltage VDD3.

The fifth NMOS transistor Tr5 charges the second node QB1 with the third voltage VDD3 output from the fourth NMOS transistor Tr4 in response to the third voltage VDD3. For this operation, the gate terminal of the fifth NMOS transistor Tr5 is connected to a drain terminal of the fourth NMOS transistor Tr4; the source terminal is connected to the power line for transferring the third voltage VDD3; and, the drain terminal is connected to the second node QB1.

The sixth NMOS transistor Tr6 discharges the first node Q with the second voltage VSS in response to the third voltage VDD3 charged in the second node QB1. For this operation, the gate terminal of the sixth NMOS transistor Tr6 is connected to the second node QB1; the source terminal is connected to the first node Q; and, the drain terminal is connected to the power line for transferring the second voltage VSS.

The seventh NMOS transistor Tr7 discharges the third node QB2 with the second voltage VSS in response to the third voltage VDD3 charged in the second node QB1. For this operation, the gate terminal of the seventh NMOS transistor Tr7 is connected to the second node QB1; the source terminal is connected to the third node QB2; and, the drain terminal is connected to the power line for transferring the second voltage VSS.

The eighth NMOS transistor Tr8 supplies the second voltage VSS to the gate terminal of the fifth NMOS transistor Tr5 in response to the first voltage VDD charged in the first node Q, to turn off the fifth NMOS transistor Tr5. For this operation, the gate terminal of the eighth NMOS transistor Tr8 is connected to the first node Q; the source terminal is connected to the gate terminal of the fifth NMOS transistor Tr5; and, the drain terminal is connected to the power line for transferring the second voltage VSS.

The ninth NMOS transistor Tr9 supplies the second voltage VSS to the gate terminal of the fifth NMOS transistor Tr5 in response to the scan pulse from the first upstream stage, to turn off the fifth NMOS transistor Tr5. That is, the ninth NMOS transistor Tr9 supplies the second voltage VSS to the gate terminal of the fifth NMOS transistor Tr5 in response to the scan pulse Vout2 from the second stage CST2, to turn off the fifth NMOS transistor Tr5. For this operation, the gate terminal of the ninth NMOS transistor Tr9 is connected to the second stage CST2; the source terminal is connected to the gate terminal of the fifth NMOS transistor Tr5; and, the drain terminal is connected to the power line for transferring the second voltage VSS.

The tenth NMOS transistor Tr10 supplies the second voltage VSS to the gate terminal of the fifth NMOS transistor Tr5 in response to the scan pulse from the first upstream stage, to turn off the fifth NMOS transistor Tr5. That is, the tenth NMOS transistor Tr10 supplies the second voltage VSS to the gate terminal of the fifth NMOS transistor Tr5 in response to the scan pulse Vout2 from the second stage CST2, to turn off the fifth NMOS transistor Tr5. For this operation, the gate terminal of the tenth NMOS transistor Tr10 is connected to the second stage CST2; the source terminal is connected to the gate terminal of the fifth NMOS transistor Tr5; and, the drain terminal is connected to the power line for transferring the second voltage VSS.

The eleventh NMOS transistor Tr11 is turned on or off in response to the fourth voltage VDD4 which is alternately varied in polarity on a frame basis. In an ON state thereof, the eleventh NMOS transistor Tr11 outputs the fourth voltage VDD4. For this operation, the gate and source terminals of the eleventh NMOS transistor Tr11 are connected to a power line for transferring the fourth voltage VDD4. The fourth voltage VDD4 has a polarity opposite to that of the third voltage VDD3 in each frame.

The twelfth NMOS transistor Tr12 charges the third node QB2 with the fourth voltage VDD4 output from the eleventh NMOS transistor Tr11 in response to the fourth voltage VDD4. For this operation, the gate terminal of the twelfth NMOS transistor Tr12 is connected to a drain terminal of the eleventh NMOS transistor Tr11; the source terminal is connected to the power line for transferring the fourth voltage VDD4; and, the drain terminal is connected to the third node QB2.

The thirteenth NMOS transistor Tr13 discharges the first node Q with the second voltage VSS in response to the fourth voltage VDD4 charged in the third node QB2. For this operation, the gate terminal of the thirteenth NMOS transistor Tr13 is connected to the third node QB2; the source terminal is connected, to the first node Q; and, the drain terminal is connected to the power line for transferring the second voltage VSS.

The fourteenth NMOS transistor Tr14 discharges the second node QB1 with the second voltage VSS in response to the fourth voltage VDD4 charged in the third node QB2. For this operation, the gate terminal of the fourteenth NMOS transistor Tr14 is connected to the third node QB2; the source terminal is connected to the second node QB1; and, the, drain terminal is connected to the power line for transferring the second voltage VSS.

The fifteenth NMOS transistor Tr15 supplies the second voltage VSS to the gate terminal of the twelfth NMOS transistor Tr12 in response to the first voltage VDD charged in the first node Q, to turn off the twelfth NMOS transistor Tr12. For this operation, the gate terminal of the fifteenth NMOS transistor Tr15 is connected to the first node Q; the source terminal is connected to the gate terminal of the twelfth NMOS transistor Tr12; and, the drain terminal is connected to the power line for transferring the second voltage VSS.

The sixteenth NMOS transistor Tr16 supplies the second voltage VSS to the gate terminal of the twelfth NMOS transistor Tr12 in response to the scan pulse from the first upstream stage, to turn off the twelfth NMOS transistor Tr12. That is, the sixteenth NMOS transistor Tr16 turns off the twelfth NMOS transistor Tr12 in response to the second scan pulse Vout2 from the second stage CST2. For this operation, the the gate terminal of the sixteenth NMOS transistor Tr16 is connected to the second stage CST2; the source terminal is connected to the gate terminal of the twelfth NMOS transistor Tr12; and, the drain terminal is connected to the power line for transferring the second voltage VSS.

The seventeenth NMOS transistor Tr17 supplies the second voltage VSS to the gate terminal of the twelfth NMOS transistor Tr12 in response to the scan pulse from the first upstream stage, to turn off the twelfth NMOS transistor Tr12. That is, the seventeenth NMOS transistor Tr17 turns off the twelfth NMOS transistor Tr12 in response to the second scan pulse Vout2 from the second stage CST2. For this operation, the gate terminal of the seventeenth NMOS transistor Tr17 is connected to the second stage CST2; the source terminal is connected to the gate terminal of the twelfth NMOS transistor Tr12; and, the drain terminal is connected to the power line for transferring the second voltage VSS.

The eighteenth NMOS transistor Tr18 discharges the second node QB1 with the second voltage VSS in response to the scan pulse from the first upstream stage. That is, the eighteenth NMOS transistor Tr18 discharges the second node QB1 with the second voltage VSS in response to the scan pulse Vout2 from the second stage CST2. For this operation, the gate terminal of the eighteenth NMOS transistor Tr18 is connected to the second stage CST2; the source terminal is connected to the second node QB1; and, the drain terminal is connected to the power line for transferring the second voltage VSS.

The nineteenth NMOS transistor Tr19 discharges the third node QB2 with the second voltage VSS in response to the scan pulse from the first upstream stage. That is, the nineteenth NMOS transistor Tr19 discharges the third node QB2 with the second voltage VSS in response to the scan pulse Vout2 from the second stage CST2. For this operation, the gate terminal of the nineteenth NMOS transistor Tr19 is connected to the second stage CST2; the source terminal is connected to the third node QB2; and, the drain terminal is connected to the power line for transferring the second voltage VSS.

The twentieth NMOS transistor Tr20 discharges the first node Q with the second voltage VSS in response to a scan pulse from the stage arranged second downstream from the third stage CST3. That is, the twentieth NMOS transistor Tr20 discharges the first node Q with the second voltage VSS in response to the fifth scan pulse Vout5 from the fifth stage CST5. For this operation, the gate terminal of the twentieth NMOS transistor Tr20 is connected to the fifth stage CST5; the source terminal is connected to the first node Q; and, the drain terminal is connected to the power line for transferring the second voltage VSS.

The first output unit 120b of the third stage CST3 includes twenty-first through twenty-third NMOS transistors Tr21 to Tr23.

The twenty-first NMOS transistor Tr21 outputs the third clock pulse CLK3 as a scan pulse, in response to the first voltage VDD charged in the first node Q. The third scan pulse Vout3 is supplied to both the second upstream stage and the first downstream stage. For this operation the gate terminal of the twenty-first NMOS transistor Tr21 is connected to the first node Q; the source terminal is connected to the clock line for transferring the third clock pulse CLK3; and, the drain terminal is connected to the gate terminal of the twentieth NMOS transistor Tr20 in the first stage CST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage CST4.

The twenty-second NMOS transistor Tr22 outputs the second voltage VSS in response to the third voltage VDD3 charged in the second node QB1. The second voltage VSS from the twenty-second NMOS transistor Tr22 is supplied to the second upstream stage and first downstream stage. For this operation, the gate terminal of the twenty-second NMOS transistor Tr22 is connected to the second node QB1; the drain terminal is connected to the power line for transferring the second voltage VSS; and, the source terminal is connected to the gate terminal of the twentieth NMOS transistor Tr20 in the first stage CST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage CST4.

The twenty-third NMOS transistor Tr23 outputs the second voltage VSS in response to the fourth voltage VDD4 charged in the third node QB2. The second voltage VSS from the twenty-third NMOS transistor Tr23 is supplied to the second upstream stage and first downstream stage. For this operation, the gate terminal of the twenty-third NMOS transistor Tr23 is connected to the second node QB1; the drain terminal is connected to the power line for transferring the second voltage VSS; and, the source terminal is connected to the gate terminal of the twentieth NMOS transistor Tr20 in the first stage CST1, and the gate terminals of the first, ninth, tenth, sixteenth, seventeenth, eighteenth, and nineteenth NMOS transistors Tr1, Tr9, Tr10, Tr16, Tr17, Tr18, and Tr19 in the fourth stage CST4.

The second output unit 120c of the third stage CST3 includes twenty-fourth through twenty-sixth NMOS transistors Tr24 to Tr26.

The twenty-fourth NMOS transistor Tr24 outputs the third clock pulse CLK3 to the third gate line as a third scan pulse Vout3, in response to the first voltage VDD charged in the first node Q. For this operation, the gate terminal of the twenty-fourth NMOS transistor Tr24 is connected to the first node Q; the source terminal is connected to the clock line for transferring the third clock pulse CLK3; and the drain terminal is connected to the third gate line.

The twenty-fifth NMOS transistor Tr25 outputs the second voltage VSS to the third gate line in response to the third voltage VDD3 charged in the second node QB1. For this operation, the gate terminal of the twenty-fifth NMOS transistor Tr25 is connected to the second node QB1; the drain terminal is connected to the power line for transferring the second voltage VSS; and, the source terminal is connected to the third gate line.

The twenty-sixth NMOS transistor Tr26 outputs the second voltage VSS to the third gate line in response to the fourth voltage VDD4 charged in the third node QB2. For this operation, the gate terminal of the twenty-sixth NMOS transistor Tr26 is connected to the second node QB1; the drain terminal is connected to the power line for transferring the second voltage VSS; and, the source terminal is connected to the third gate line.

The first and second stages CST1 and CST2, fourth through n-th stages CST4 to CSTn, and first and second dummy stages CSTn+1 and CSTn+2 have the same configuration as the third stage CST3.

However, since there is no stage upstream from the first stage CST1, the first, ninth, tenth, sixteenth, seventeenth, eighteenth, and nineteenth NMOS transistors Tr1, Tr9, Tr10, Tr16, Tr17, Tr18, and Tr19 in the first stage CST1 receive a start pulse SP from the timing controller. That is, the first NMOS transistor Tr1 of the first stage CST1 charges the first node Q of the first stage CST1 with the first voltage VDD in response to the start pulse SP from the timing controller.

The ninth NMOS transistor Tr9 of the first stage CST1 discharges the second node QB1 of the first stage CST1 with the second voltage VSS in response to the start pulse SP from the timing controller.

The tenth NMOS transistor Tr10 of the first stage CST1 supplies the second voltage VSS to the gate terminal of the fourth NMOS transistor Tr4 in response to the start pulse SP from the timing controller, to turn off the fourth NMOS transistor Tr4.

The sixteenth NMOS transistor Tr16 of the first stage CST1 supplies the second voltage VSS to the gate terminal of the twentieth NMOS transistor Tr12 in response to the start pulse SP from the timing controller, to turn off the twentieth NMOS transistor Tr12.

The seventeenth NMOS transistor Tr17 of the first stage CST1 supplies the second voltage VSS to the gate terminal of the twentieth NMOS transistor Tr12 in response to the start pulse SP from the timing controller, to turn off the twentieth NMOS transistor Tr12.

The eighteenth NMOS transistor Tr18 of the first stage CST1 discharges the second node QB1 with the second voltage VSS in response to the start pulse SP from the timing controller.

The nineteenth NMOS transistor Tr19 of the first stage CST1 discharges the third node QB2 with the second voltage VSS in response to the start pulse SP from the timing controller.

There is no stage arranged second upstream from the first stage CST1 or second stage CST2. For this reason, the first stage CST1 supplies the first scan pulse Vout1 output therefrom to the first gate line and second stage CST2. Similarly, the second stage CST2 supplies the second scan pulse Vout2 output therefrom to the second gate line and third stage CST3.

There is no stage arranged first downstream from the second dummy stage CSTn+2. Accordingly, the source terminal of the twenty-first NMOS transistor Tr21, the drain terminal of the twenty-second NMOS transistor Tr22, and the drain terminal of the twenty-third NMOS transistor Tr23 in the second dummy stage CSTn+2 are connected to the gate terminal of the twentieth NMOS transistor Tr20 of the n-th stage CSTn.

The stages CST1 to CSTn+2 of the second shift register 110b have the same configuration as the stages CST1 to CSTn+2 of the first shift register 110a.

Figure 13A:
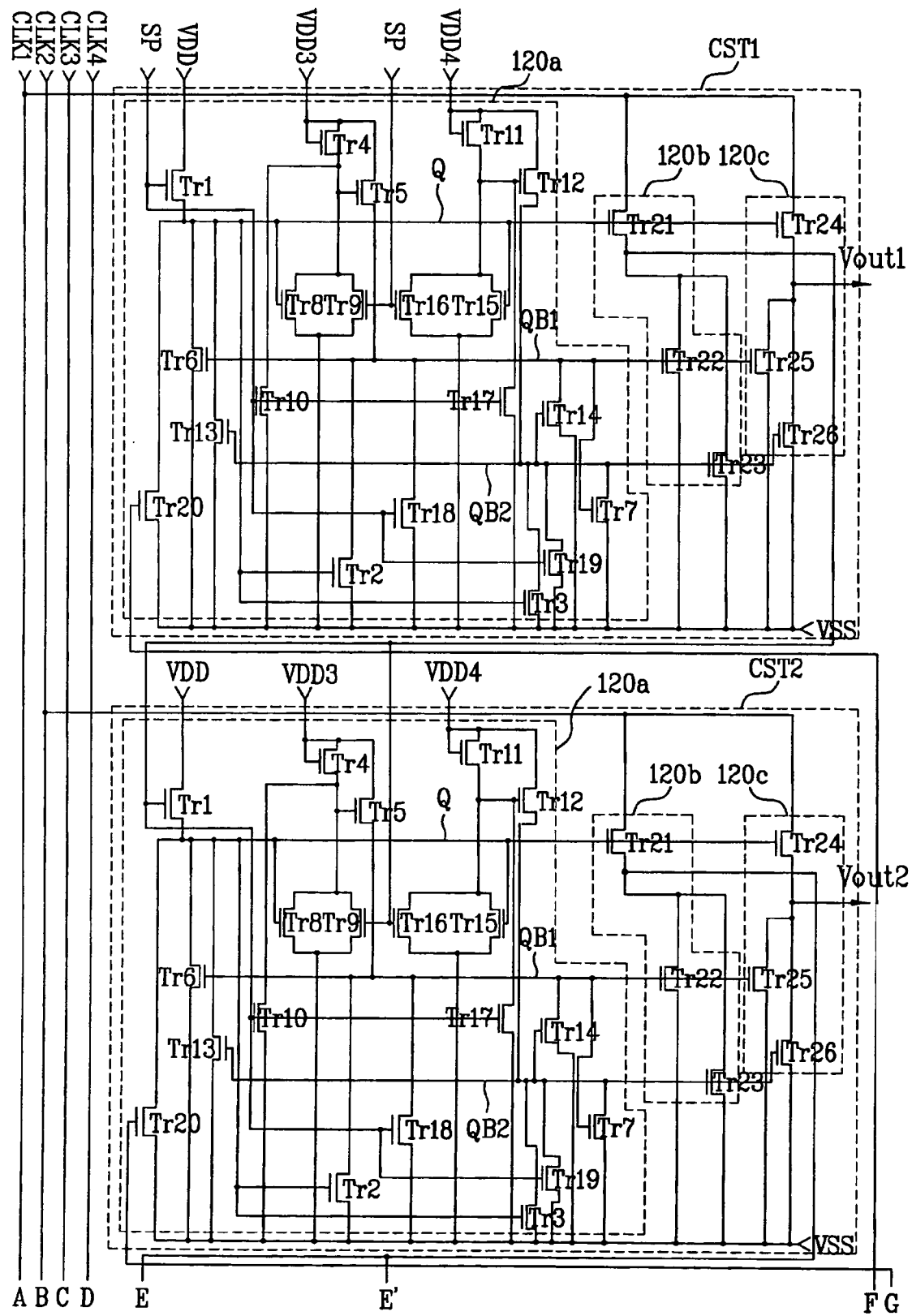
FIGS. 13A and 13B are circuit diagrams illustrating the third stage of the first shift register having the circuit configuration shown in FIG. 12.
Figure 13B:
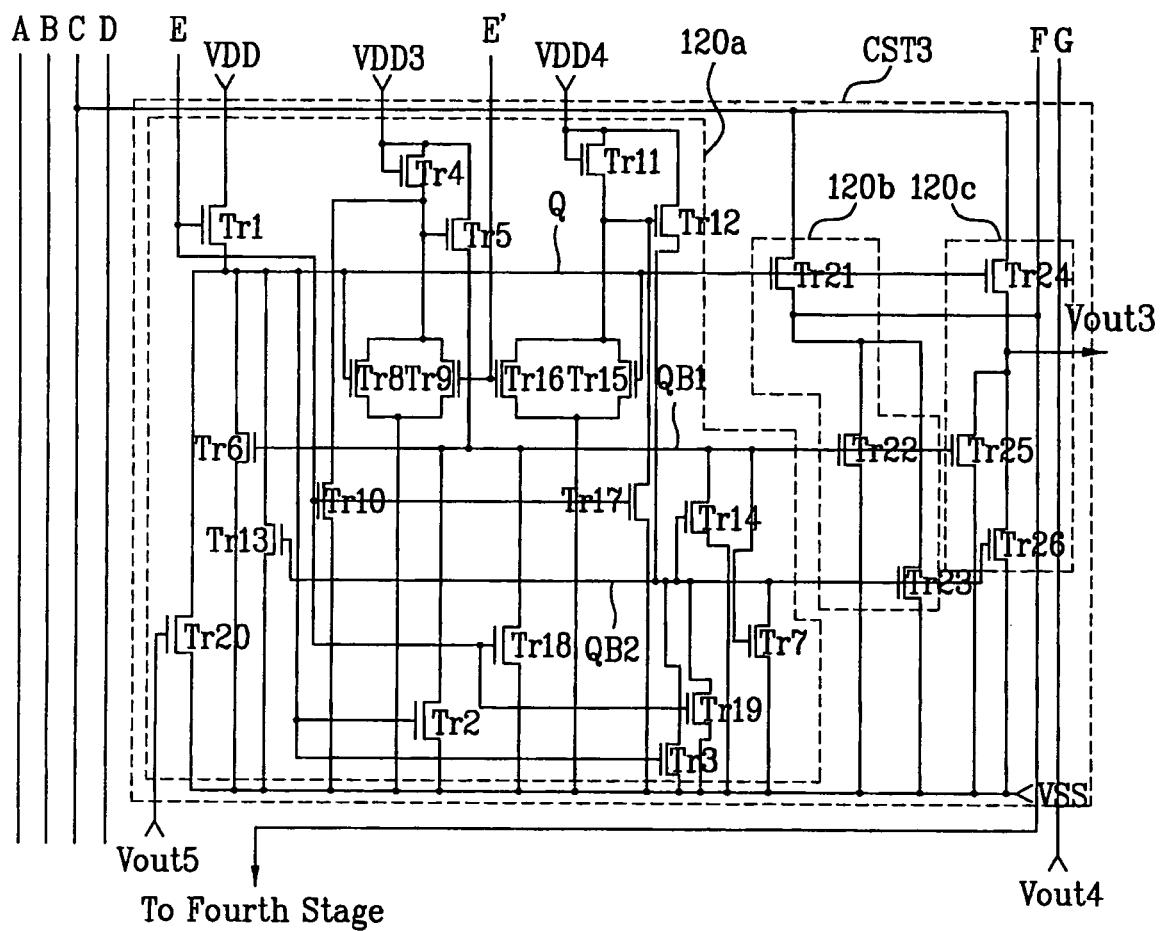

FIGS. 13A and 13B are circuit diagrams illustrating the third stage of the first shift register having the circuit configuration shown in FIG. 12.

The shift register according to the second embodiment operates in the same manner as the circuits of the first embodiment shown in FIGS. 9, 10A, and 10B. However, each of the stages CST1 to CSTn+2 in the shift register according to the second embodiment outputs two scan pulses. One scan pulse from each stage is supplied to the first downstream stage and second upstream stage. The other scan pulse from each stage is supplied to the associated gate line. Each of the first and second dummy stages CSTn+1 and CSTn+2 may output a single scan pulse.

As apparent from the above description, the shift register of the LCD device according to the present invention sequentially outputs scan pulses having an increased pulse width such that successive ones of the scan pulses are overlapped with each other for a predetermined time. Accordingly, it is possible to increase the effective charging time for which the scan pulses are maintained at a target voltage, and thus, to prevent distortion of the scan pulses. In this case, it is possible to secure a sufficient effective charging time for normal application of a data voltage to pixel electrodes even when the scan pulses are distorted by the resistance and capacitance components of gate lines.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A gate driver for driving gate lines of a display device comprising:

a first shift register for sequentially supplying first scan pulses to first-side ends of gate lines, the first shift register simultaneously driving at least two adjacent first-side gate lines for a predetermined period of time, wherein the first shift register includes a plurality of stages arranged sequentially, and adapted to supply the first scan pulses to the first-side gate lines;

a second shift register for sequentially supplying second scan pulses to second-side ends of gate lines, the second shift register simultaneously driving at least two adjacent second-side gate lines for a predetermined period of time;

wherein each of the stages included in the first shift register comprises: a node controller for controlling logic states of first, second, and third nodes; a first output unit for outputting one of an associated scan pulses or off voltage in accordance with the logic states of the first, second, and third nodes, and supplying output one of the scan pulse or off voltage to an associated one of the first side gate lines, wherein the scan pulse or off voltage from the first output unit is output through a first output terminal; and a second output unit for outputting one of the associated scan pulse or the off voltage in accordance with the logic states of the first, second, and third nodes, and supplying one of the output scan pulse or the off voltage to one of the stages arranged downstream from the stage, and to one of the stages arranged upstream from the stage, wherein the scan pulse or off voltage from the second output unit is output through a second output terminal;

wherein the node controller of an n-th one of the stages included in the first shift register comprises:

a first switching element for charging the first node with a first voltage in response to one of a start pulse and the scan pulse from an n–1-th stage;

a second switching element for discharging the second node with a second voltage in response to the first voltage charged in the first node;

a third switching element for discharging the third node with the second voltage in response to the first voltage charged in the first node;

a fourth switching element for outputting a third voltage, which is alternately varied in polarity on a frame basis, when the fourth switching element is turned on, the fourth switching element being turned on or off in response to the third voltage;

a fifth switching element for charging the second node with the third voltage in response to the third voltage output from the fourth switching element;

a sixth switching element for discharging the first node with the second voltage in response to the third voltage charged in the second node;

a seventh switching element for discharging the third node with the second voltage in response to the third voltage charged in the second node;

an eighth switching element for supplying the second voltage to a gate terminal of the fifth switching element in response to the first voltage charged in the first node, to turn off the fifth switching element;

a ninth switching element for supplying the second voltage to the gate terminal of the fifth switching element in response to one of the start pulse or the scan pulse from the n−1-th stage, to turn off the fifth switching element;

a tenth switching element for supplying the second voltage to the gate terminal of the fifth switching element in response to one of the start pulse or the scan pulse from the n−1-th stage, to turn off the fifth switching element;

an eleventh switching element for outputting a fourth voltage, which has a polarity opposite to the polarity of the third voltage, when the eleventh switching element is turned on, the eleventh switching element being turned on or off in response to the fourth voltage;

a twelfth switching element for charging the third node with the fourth voltage in response to the fourth voltage output from the eleventh switching element;

a thirteenth switching element for discharging the first node with the second voltage in response to the fourth voltage charged in the third node;

a fourteenth switching element for discharging the second node with the second voltage in response to the fourth voltage charged in the third node;

a fifteenth switching element for supplying the second voltage to a gate terminal of the twelfth switching element in response to the first voltage charged in the first node, to turn off the twelfth switching element;

a sixteenth switching element for supplying the second voltage to the gate terminal of the twelfth switching element in response to one of the start pulse or the scan pulse from the n−1-th stage, to turn off the twelfth switching element;

a seventeenth switching element for supplying the second voltage to the gate terminal of the twelfth switching element in response to one of the start pulse or the scan pulse from the n−1-th stage, to turn off the twelfth switching element;

an eighteenth switching element for discharging the second node with the second voltage in response to one of the start pulse or the scan pulse from the n−1-th stage;

a nineteenth switching element for discharging the third node with the second voltage in response to one of the start pulse or the scan pulse from the n−1-th stage; and a twentieth switching element for discharging the first node with the second voltage in response to the scan pulse from an n+2-th stage.

2. The gate driver according to claim 1, wherein the first scan pulse for driving a n+1-th first side gate line ("n" is a natural number) is supplied to the n+1-th first-side gate line within a period of time for which the first scan pulse for driving the n-th first-side gate line is in an active state.

3. The gate driver according to claim 1, wherein the second scan pulse for driving a n+1-th second-side gate line ("n" is a natural number) is supplied to the n+1-th second side gate line within a period of time for which the second scan pulse for driving the n-th second-side gate line is in an active state.

4. The gate driver of claim 3, wherein the second scan pulse for driving the n+1-th second-side gate line is supplied simultaneously with the first scan pulse for driving the n+1-th first-side gate line.

5. The gate driver of claim 4, wherein the first-side end of the n-th gate line and second side end of the n-the gate line are opposite ends of the same gate line.

6. The gate driver according to claim 1, further comprising:
a timing controller for supplying a plurality of clock pulses each having a time or phase difference from one another to the first shift register.

7. The gate driver according to claim 1, further comprising:
a timing controller for supplying a plurality of clock pulses each having a time or phase difference from one another to the first shift register and to the second shift register.

8. The gate driver according to claim 3, wherein the sequential clock pulses outputted in adjacent time periods have a concurrent active state for a predetermined period of time.

9. The gate driver according to claim 4, wherein the time period where successive clock pulses are simultaneously in an active state has a period equal to a time period for which successive scan pulses are simultaneously in an active state.

10. The gate driver according to claim 1, wherein the second shift register includes a plurality of stages arranged sequentially, and adapted to supply the second scan pulses to the second-side gate lines.

11. The gate driver according to claim 1, wherein:
a first one of the stages in the first shift register is enabled in response to a first start pulse; and
a second one of the stages included in the first shift register is enabled in response to a second start pulse.

12. The gate driver according to claim 11, wherein:
the first shift register further comprises:
a first dummy stage for outputting a scan pulse for disabling a stage arranged next upstream from a last one of the stages in the first shift register; and
a second dummy stage for outputting a scan pulse for disabling last one of the stages in the first shift register.

13. The gate driver according to claim 12, wherein the second dummy stage is enabled in response to the scan pulse output from the first dummy stage.

14. The gate driver according to claim 1, wherein the first output unit of the n-th stage in the first shift register further comprises:
a twenty-first switching element for supplying a scan pulse to the gate line associated with the n-th stage in response to the first voltage charged in the first node;
a twenty-second switching element for supplying the second voltage to the gate line in response to the third voltage charged in the second node; and
a twenty-third switching element for supplying the second voltage to the gate line in response to the fourth voltage charged in the third node.

15. The gate driver according to claim 14, wherein the second output unit of the n-th stage in the first shift register further comprises:
a twenty-fourth switching element for supplying a scan pulse to n+1-th and n−2-th stages in response to the first voltage charged in the first node;
a twenty-fifth switching element for supplying the second voltage to the n+1-th and n−2-th stages in response to the third voltage charged in the second node; and
a twenty-sixth switching element for supplying the second voltage to the n+1-th and n−2-th stages in response to the fourth voltage charged in the third node.

16. The gate driver according to claim 7, wherein each of the stages included in the second shift register is enabled in response to the second scan pulse output from one of the stages arranged upstream from the stage, to output an associated one of the second scan pulses, and is disabled in response to the second scan pulse output from one of the stages arranged downstream from the stage.

17. The gate driver according to claim 16, wherein an n-th one of the stages included in the second shift register (where "n" is a natural number) is enabled in response to the second scan pulse output from the n−1-th stage, to output an associated one of the second scan pulses, and is disabled in response to the scan pulse output from the n+2-th stage.

18. The gate driver according to claim 17, wherein:
a first one of the stages included in the second shift register is enabled in response to a first start pulse; and
a second one of the stages included in the second shift register is enabled in response to a second start pulse.

19. The gate driver according to claim 17, wherein:
the second shift register further comprises:
a first dummy stage for outputting a scan pulse for disabling a last one of the stages in the second shift register; and
a second dummy stage for outputting a scan pulse for disabling the stage arranged next upstream from the last stage.

20. The gate driver according to claim 19, wherein the second dummy stage is enabled in response to the scan pulse output from the first dummy stage.

21. The gate driver according to claim 10, wherein each of the stages included in the second shift register includes:
a node controller for controlling logic states of first, second, and third nodes; and
a first output unit for outputting one of scan pulse or off voltage in accordance with the logic states of the first, second, and third nodes, and supplying one of output scan pulse or off voltage to an associated one of the gate lines; and
a second output unit for outputting one of scan pulse or off voltage in accordance with the logic states of the first, second, and third nodes, and supplying one of the output scan pulse or off voltage to one of the stages arranged downstream from the stage in subject, and to one of the stages arranged upstream from the stage in subject.

22. The gate driver according to claim 21, wherein the node controller of an n-th one of the stages included in the second shift register includes:
a first switching element for charging the first node with a first voltage in response to one of a start pulse and the scan pulse from an n−1-th stage;
a second switching element for discharging the second node with a second voltage in response to the first voltage charged in the first node;
a third switching element for discharging the third node with the second voltage in response to the first voltage charged in the first node;
a fourth switching element for outputting a third voltage, which is alternately varied in polarity on a frame basis, when the fourth switching element is turned on, the fourth switching element being turned on or off in response to the third voltage;
a fifth switching element for charging the second node with the third voltage in response to the third voltage output from the fourth switching element;
a sixth switching element for discharging the first node with the second voltage in response to the third voltage charged in the second node;
a seventh switching element for discharging the third node with the second voltage in response to the third voltage charged in the second node;
an eighth switching element for supplying the second voltage to a gate terminal of the fifth switching element in response to the first voltage charged in the first node, to turn off the fifth switching element;
a ninth switching element for supplying the second voltage to the gate terminal of the fifth switching element in response to one of the start pulse or the scan pulse from the n−1-th stage, to turn off the fifth switching element;
a tenth switching element for supplying the second voltage to the gate terminal of the fifth switching element in response to one of the start pulse or the scan pulse from n−1 stages, to turn off the fifth switching element;
an eleventh switching element for outputting a fourth voltage, which has a polarity opposite to the polarity of the third voltage, when the eleventh switching element is turned on, the eleventh switching element being turned on or off in response to the fourth voltage;
a twelfth switching element for charging the third node with the fourth voltage in response to the fourth voltage output from the eleventh switching element;
a thirteenth switching element for discharging the first node with the second voltage in response to the fourth voltage charged in the third node;
a fourteenth switching element for discharging the second node with the second voltage in response to the fourth voltage charged in the third node;
a fifteenth switching element for supplying the second voltage to a gate terminal of the twelfth switching element in response to the first voltage charged in the first node, to turn off the twelfth switching element;
a sixteenth switching element for supplying the second voltage to the gate terminal of the twelfth switching element in response to one of the start pulse or the scan pulse from the n−1-th stage, to turn off the twelfth switching element;
a seventeenth switching element for supplying the second voltage to the gate terminal of the twelfth switching element in response to one of the start pulse or the scan pulse from the n−1-th stage, to turn off the twelfth switching element;
an eighteenth switching element for discharging the second node with the second voltage in response to one of the start pulse or the scan pulse from the n−1-th stage;
a nineteenth switching element for discharging the third node with the second voltage in response to one of the start pulse or the scan pulse from the n−1-th stage; and
a twentieth switching element for discharging the first node with the second voltage in response to the scan pulse from an n+2-th stage.

23. The gate driver according to claim 22, wherein the first output unit of the n-th stage in the second shift register further includes:
a twenty-first switching element for supplying a scan pulse to the gate line associated with the n-th stage in response to the first voltage charged in the first node;
a twenty-second switching element for supplying the second voltage to the gate line in response to the third voltage charged in the second node; and a twenty-third switching element for supplying the second voltage to the gate line in response to the fourth voltage charged in the third node.

24. The gate driver according to claim 23, wherein the second output unit of the n-th stage in the second shift register further includes:

a twenty-fourth switching element for supplying a scan pulse to n+1-th and n−2-th stages in response to the first voltage charged in the first node;

a twenty-fifth switching element for supplying the second voltage to the n+1-th and n−2-th stages in response to the third voltage charged in the second node; and a twenty-sixth switching element for supplying the second voltage to the n+1-th and n−2-th stages in response to the fourth voltage charged in the third node.

* * * * *